United States Patent
Tandon et al.

(10) Patent No.: US 10,338,474 B2
(45) Date of Patent: Jul. 2, 2019

(54) UNDERLYING ABSORBING OR CONDUCTING LAYER FOR EBEAM DIRECT WRITE (EBDW) LITHOGRAPHY

(71) Applicant: Intel Corporation, Santa Clara, CA (US)

(72) Inventors: Shakul Tandon, Hillsboro, OR (US); Yan A. Borodovsky, Portland, OR (US); Charles H. Wallace, Portland, OR (US); Paul A. Nyhus, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 21 days.

(21) Appl. No.: 15/528,329

(22) PCT Filed: Jun. 18, 2015

(86) PCT No.: PCT/US2015/036502
§ 371 (c)(1),
(2) Date: May 19, 2017

(87) PCT Pub. No.: WO2016/114815
PCT Pub. Date: Jul. 21, 2016

(65) Prior Publication Data
US 2017/0338105 A1 Nov. 23, 2017

Related U.S. Application Data

(60) Provisional application No. 62/103,459, filed on Jan. 14, 2015.

(51) Int. Cl.
| | | |
|---|---|---|
| *G03F 7/09* | (2006.01) |
| *G03F 7/11* | (2006.01) |
| *G03F 7/20* | (2006.01) |
| *H01L 21/027* | (2006.01) |
| *H01L 21/3213* | (2006.01) |
| *H01L 21/311* | (2006.01) |
| *H01L 21/8234* | (2006.01) |

(52) U.S. Cl.
CPC .............. *G03F 7/2059* (2013.01); *G03F 7/093* (2013.01); *G03F 7/11* (2013.01); *H01L 21/0277* (2013.01); *H01L 21/32133* (2013.01); *H01L 21/32139* (2013.01); *H01L 21/31111* (2013.01); *H01L 21/31144* (2013.01); *H01L 21/823431* (2013.01)

(58) Field of Classification Search
CPC .......... G03F 7/093; G03F 7/11; G03F 7/2059; H01L 21/0277; H01L 21/32133; H01L 21/32139
USPC ................................. 430/296, 942
See application file for complete search history.

(56) References Cited

U.S. PATENT DOCUMENTS

| | | |
|---|---|---|
| 4,810,617 A | 3/1989 | White |
| 6,017,658 A | 1/2000 | Rhee et al. |
| 6,635,393 B2 | 10/2003 | Pierrat |
| 2002/0136964 A1 | 9/2002 | Pierrat |
| 2007/0009811 A1 | 1/2007 | Nagahama et al. |
| 2009/0170010 A1 | 7/2009 | Belleson et al. |
| 2011/0076843 A1 | 3/2011 | Huang et al. |
| 2013/0071790 A1 | 3/2013 | Huang et al. |
| 2014/0045123 A1 | 2/2014 | Sagehashi et al. |
| 2014/0342272 A1 | 11/2014 | Lu et al. |

FOREIGN PATENT DOCUMENTS

JP 2004214435 7/2004

OTHER PUBLICATIONS

International Search Report and Written Opinion for PCT Patent Application No. PCT/US2015/036502 dated Sep. 30, 2015, 14 pgs.
International Preliminary Report on Patentability for International Patent Application No. PCT/US2015/036502, dated Jul. 27, 2017, 11 pages.
Search Report from European Patent Application No. 15878247.4, dated Jul. 25, 2018, 8 pages.
Office Action for Taiwan Patent Application No. 104141301 dated Feb. 27, 2019, 8 pgs., no translation.

*Primary Examiner* — Christopher G Young
(74) *Attorney, Agent, or Firm* — Schwabe, Williamson & Wyatt P.C.

(57) ABSTRACT

Lithographic apparatuses suitable for, and methodologies involving, complementary e-beam lithography (CEBL) are described. Particular embodiments are directed to implementation of an underlying absorbing and/or conducting layer for ebeam direct write (EBDW) lithography.

25 Claims, 14 Drawing Sheets

UNDERLYING ABSORBING OR CONDUCTING LAYER FOR EBEAM DIRECT WRITE (EBDW) LITHOGRAPHY

CROSS REFERENCE TO RELATED APPLICATIONS CLAIM OF PRIORITY

This application is a U.S. National Phase application under 35 U.S.C. § 371 of International Application No. PCT/US2015/036502, filed Jun. 18, 2015, entitled "UNDERLYING ABSORBING OR CONDUCTING LAYER FOR EBEAM DIRECT WRITE (EBDW) LITHOGRAPHY," which claims the benefit of U.S. Provisional Application No. 62/103,459, filed on Jan. 14, 2015, the entire contents of which are incorporated by reference herein.

TECHNICAL FIELD

Embodiments of the invention are in the field of lithography and, in particular, lithography involving complementary e-beam lithography (CEBL).

BACKGROUND

For the past several decades, the scaling of features in integrated circuits has been a driving force behind an ever-growing semiconductor industry. Scaling to smaller and smaller features enables increased densities of functional units on the limited real estate of semiconductor chips.

Integrated circuits commonly include electrically conductive microelectronic structures, which are known in the art as vias. Vias can be used to electrically connect metal lines above the vias to metal lines below the vias. Vias are typically formed by a lithographic process. Representatively, a photoresist layer may be spin coated above a dielectric layer, the photoresist layer may be exposed to patterned actinic radiation through a patterned mask, and then the exposed layer may be developed in order to form an opening in the photoresist layer. Next, an opening for the via may be etched in the dielectric layer by using the opening in the photoresist layer as an etch mask. This opening is referred to as a via opening. Finally, the via opening may be filled with one or more metals or other conductive materials to form the via.

In the past, the sizes and the spacing of vias has progressively decreased, and it is expected that in the future the sizes and the spacing of the vias will continue to progressively decrease, for at least some types of integrated circuits (e.g., advanced microprocessors, chipset components, graphics chips, etc.). One measure of the size of the vias is the critical dimension of the via opening. One measure of the spacing of the vias is the via pitch. Via pitch represents the center-to-center distance between the closest adjacent vias. When patterning extremely small vias with extremely small pitches by such lithographic processes, several challenges present themselves.

One such challenge is that the overlay between the vias and the overlying metal lines, and the overlay between the vias and the underlying metal lines, generally needs to be controlled to high tolerances on the order of a quarter of the via pitch. As via pitches scale ever smaller over time, the overlay tolerances tend to scale with them at an even greater rate than lithographic equipment is able to scale with.

Another such challenge is that the critical dimensions of the via openings generally tend to scale faster than the resolution capabilities of lithographic scanners. Shrink technologies exist to shrink the critical dimensions of the via openings. However, the shrink amount tends to be limited by the minimum via pitch, as well as by the ability of the shrink process to be sufficiently optical proximity correction (OPC) neutral, and to not significantly compromise line width roughness (LWR) and/or critical dimension uniformity (CDU).

Yet another such challenge is that the LWR and/or CDU characteristics of photoresists generally need to improve as the critical dimensions of the via openings decrease in order to maintain the same overall fraction of the critical dimension budget. However, currently the LWR and/or CDU characteristics of most photoresists are not improving as rapidly as the critical dimensions of the via openings are decreasing. A further such challenge is that the extremely small via pitches generally tend to be below the resolution capabilities of even extreme ultraviolet (EUV) lithographic scanners. As a result, commonly two, three, or more different lithographic masks may have to be used, which tends to increase the fabrication costs. At some point, if pitches continue to decrease, it may not be possible, even with multiple masks, to print via openings for these extremely small pitches using conventional scanners.

In the same vein, the fabrication of cuts (i.e., disruptions) in the metal line structures associated with metal vias is faced with similar scaling issues.

Thus, improvements are needed in the area of lithographic processing technologies and capabilities.

DESCRIPTION OF THE EMBODIMENTS

Lithographic apparatuses suitable for, and methodologies involving, complementary e-beam lithography (CEBL) are described. In the following description, numerous specific details are set forth, such as specific tooling, integration and material regimes, in order to provide a thorough understanding of embodiments of the present invention. It will be apparent to one skilled in the art that embodiments of the present invention may be practiced without these specific details. In other instances, well-known features, such as single or dual damascene processing, are not described in detail in order to not unnecessarily obscure embodiments of the present invention. Furthermore, it is to be understood that the various embodiments shown in the Figures are illustrative representations and are not necessarily drawn to scale. In some cases, various operations will be described as multiple discrete operations, in turn, in a manner that is most helpful in understanding the present invention, however, the order of description should not be construed to imply that these operations are necessarily order dependent. In particular, these operations need not be performed in the order of presentation.

One or more embodiments described herein are directed to lithographic approaches and tooling involving or suitable for complementary e-beam lithography (CEBL), including semiconductor processing considerations when implementing such approaches and tooling. Particular embodiments are directed to implementation of an underlying absorbing and/or conducting layer for ebeam direct write (EBDW) lithography.

Complementary lithography draws on the strengths of two lithography technologies, working hand-in-hand, to lower the cost of patterning critical layers in logic devices at 20 nm half-pitch and below, in high-volume manufacturing (HVM). The most cost-effective way to implement complementary lithography is to combine optical lithography with e-beam lithography (EBL). The process of transferring integrated circuit (IC) designs to the wafer entails the following: optical lithography to print unidirectional lines (either strictly unidirectional or predominantly unidirectional) in a pre-defined pitch, pitch division techniques to increase line density, and EBL to "cut" the lines. EBL is also used to pattern other critical layers, notably contact and via holes. Optical lithography can be used alone to pattern other layers. When used to complement optical lithography, EBL is referred to as CEBL, or complementary EBL. CEBL is directed to cutting lines and holes. By not attempting to pattern all layers, CEBL plays a complementary but crucial role in meeting the industry's patterning needs at advanced (smaller) technology nodes (e.g., 10 nm or smaller such as 7 nm or 5 nm technology nodes). CEBL also extends the use of current optical lithography technology, tools and infrastructure.

Figure 1A:
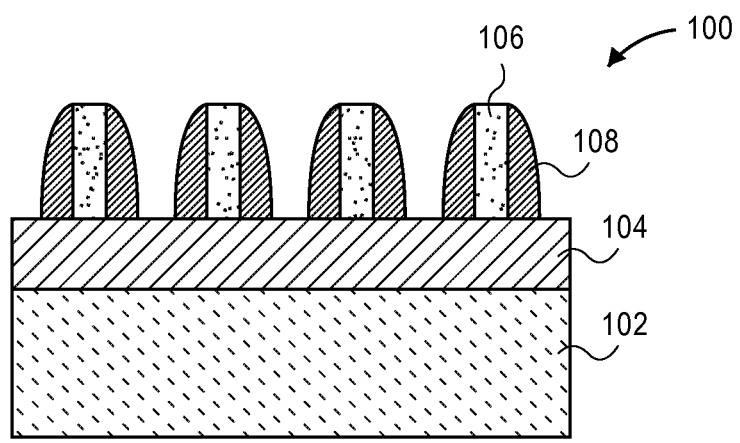
FIG. 1A illustrates a cross-sectional view of a starting structure following deposition, but prior to patterning, of a hardmask material layer formed on an interlayer dielectric (ILD) layer.
Figure 1B:
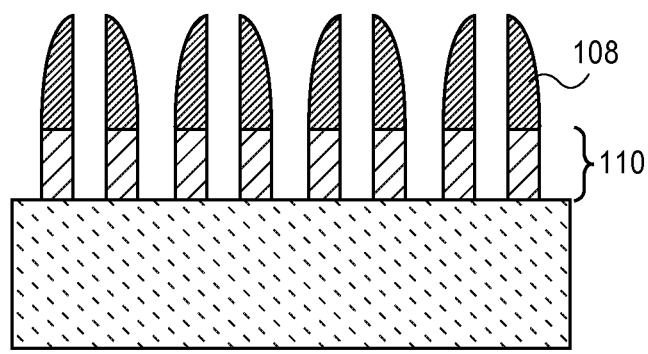
FIG. 1B illustrates a cross-sectional view of the structure of FIG. 1A following patterning of the hardmask layer by pitch halving.

As mentioned above, pitch division techniques can be used to increase a line density prior to using EBL to cut such lines. In a first example, pitch halving can be implemented to double the line density of a fabricated grating structure. FIG. 1A illustrates a cross-sectional view of a starting structure following deposition, but prior to patterning, of a hardmask material layer formed on an interlayer dielectric (ILD) layer. FIG. 1B illustrates a cross-sectional view of the structure of FIG. 1A following patterning of the hardmask layer by pitch halving.

Referring to FIG. 1A, a starting structure 100 has a hardmask material layer 104 formed on an interlayer dielectric (ILD) layer 102. A patterned mask 106 is disposed above the hardmask material layer 104. The patterned mask 106 has spacers 108 formed along sidewalls of features (lines) thereof, on the hardmask material layer 104.

Referring to FIG. 1B, the hardmask material layer 104 is patterned in a pitch halving approach. Specifically, the patterned mask 106 is first removed. The resulting pattern of the spacers 108 has double the density, or half the pitch or the features of the mask 106. The pattern of the spacers 108 is transferred, e.g., by an etch process, to the hardmask material layer 104 to form a patterned hardmask 110, as is depicted in FIG. 1B. In one such embodiment, the patterned hardmask 110 is formed with a grating pattern having unidirectional lines. The grating pattern of the patterned hardmask 110 may be a tight pitch grating structure. For example, the tight pitch may not be achievable directly through conventional lithography techniques. Even further, although not shown, the original pitch may be quartered by a second round of spacer mask patterning. Accordingly, the grating-like pattern of the patterned hardmask 110 of FIG. 1B may have hardmask lines spaced at a constant pitch and having a constant width relative to one another. The dimensions achieved may be far smaller than the critical dimension of the lithographic technique employed.

Accordingly, as a first portion of a CEBL integration scheme, a blanket film may be patterned using lithography and etch processing which may involve, e.g., spacer-based-double-patterning (SBDP) or pitch halving, or spacer-based-quadruple-patterning (SBQP) or pitch quartering. It is to be appreciated that other pitch division approaches may also be implemented.

Figure 2:
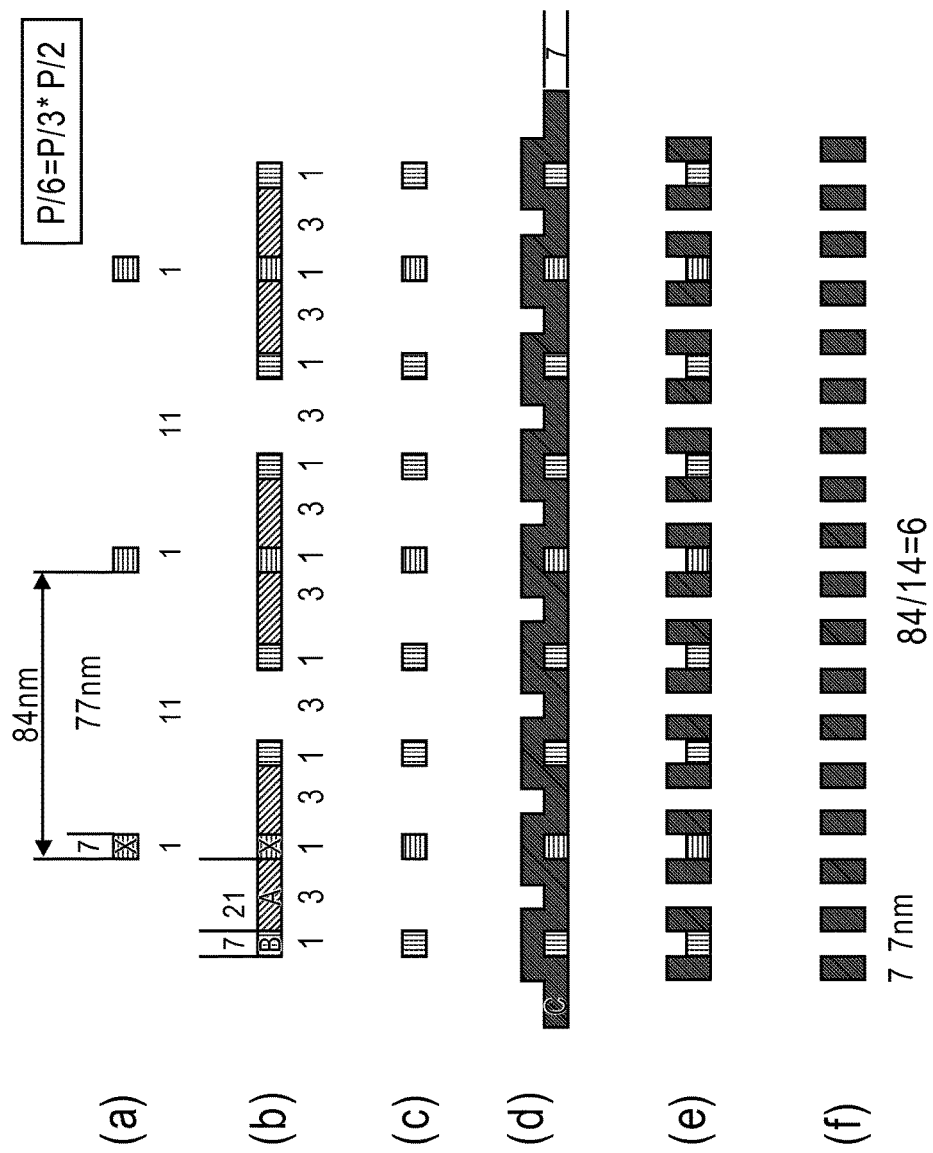
FIG. 2 illustrates cross-sectional views in a spacer-based-sextuple-patterning (SBSP) processing scheme which involves pitch division by a factor of six.

For example, FIG. 2 illustrates cross-sectional views in a spacer-based-sextuple-patterning (SBSP) processing scheme which involves pitch division by a factor of six. Referring to FIG. 2, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C deposition. At operation (e), the pattern of operation (d) is shown following spacer C etch. At operation (f), a pitch/6 pattern is achieved following sacrificial pattern X removal and spacer B removal.

Figure 3:
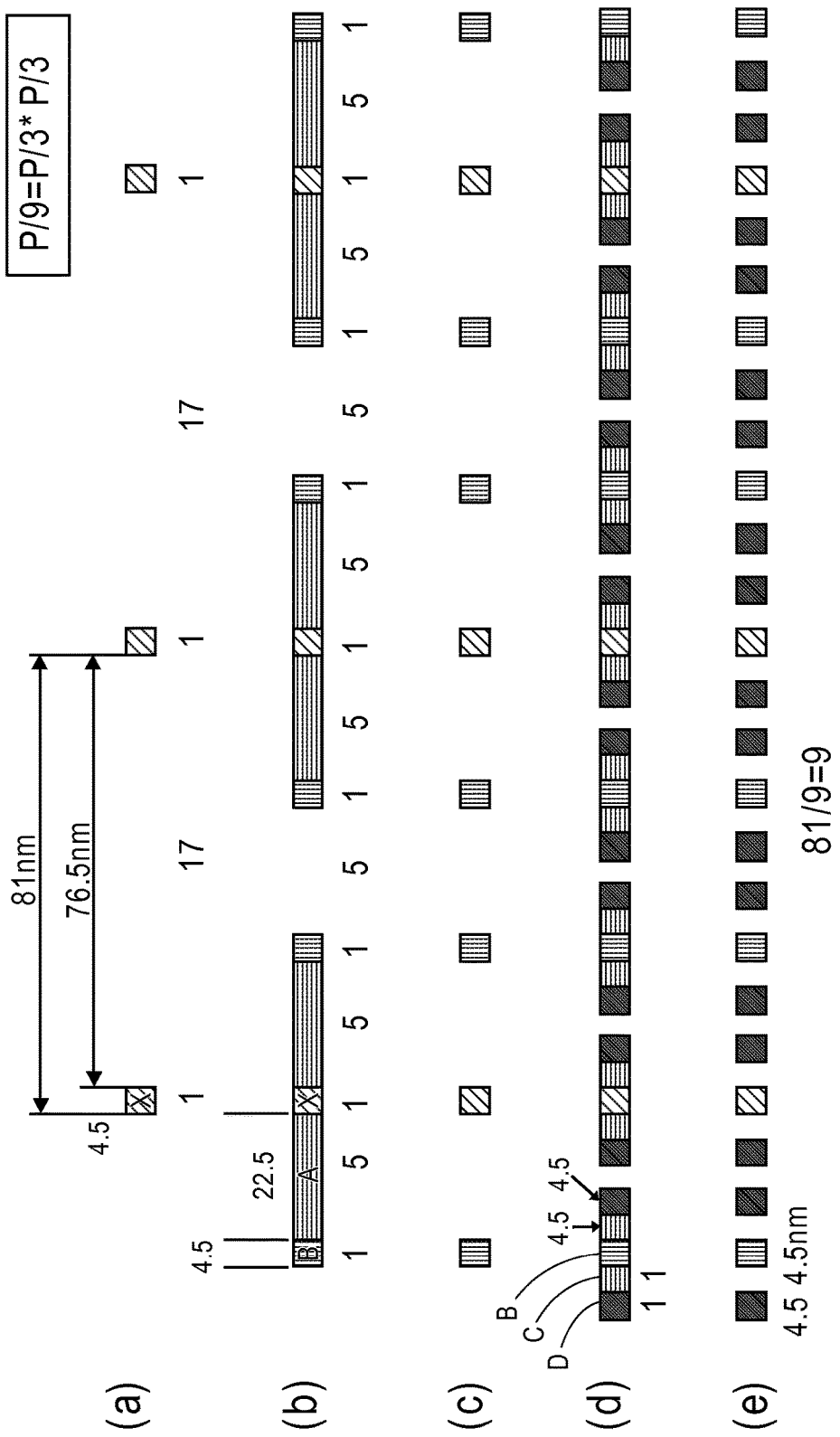
FIG. 3 illustrates cross-sectional views in a spacer-based-nonuple-patterning (SBNP) processing scheme which involves pitch division by a factor of nine.

In another example, FIG. 3 illustrates cross-sectional views in a spacer-based-nonuple-patterning (SBNP) processing scheme which involves pitch division by a factor of nine. Referring to FIG. 3, at operation (a), a sacrificial pattern X is shown following litho, slim and etch processing. At operation (b), spacers A and B are shown following deposition and etching. At operation (c), the pattern of operation (b) is shown following spacer A removal. At operation (d), the pattern of operation (c) is shown following spacer C and D deposition and etch. At operation (e), a pitch/9 pattern is achieved following spacer C removal.

In any case, in an embodiment, complementary lithography as described herein involves first fabricating a gridded layout by conventional or state-of the-art lithography, such as 193 nm immersion lithography (193i). Pitch division may be implemented to increase the density of lines in the gridded layout by a factor of n. Gridded layout formation with 193i lithography plus pitch division by a factor of n can be designated as 193i+P/n Pitch Division. Patterning of the pitch divided gridded layout may then be patterned using electron beam direct write (EBDW) "cuts," as is described in greater detail below. In one such embodiment, 193 nm immersion scaling can be extended for many generations with cost effective pitch division. Complementary EBL is used to break gratings continuity and to pattern vias.

More specifically, embodiments described herein are directed to patterning features during the fabrication of an integrated circuit. In one embodiment, CEBL is used to pattern openings for forming vias. Vias are metal structures used to electrically connect metal lines above the vias to metal lines below the vias. In another embodiment, CEBL is used to form non-conductive spaces or interruptions along the metal lines. Conventionally, such interruptions have been referred to as "cuts" since the process involved removal or cutting away of portions of the metal lines. However, in a damascene approach, the interruptions may be referred to as "plugs" (also known in the art as blocking mask) which may be regions along a metal line trajectory that are actually not metal at any stage of the fabrication scheme, but are rather preserved regions where metal cannot be formed. In either case, however, use of the terms cuts or plugs may be done so interchangeably. Via opening and metal line cut or plug formation is commonly referred to as back end of line (BEOL) processing for an integrated circuit. In another embodiment, CEBL is used for front end of line (FEOL) processing. For example, the scaling of active region dimensions (such as fin dimensions) and/or associated gate structures can be performed using CEBL techniques as described herein.

As described above, electron beam (ebeam) lithography may be implemented to complement standard lithographic techniques in order to achieved desired scaling of features for integrated circuit fabrication. An electron beam lithography tool may be used to perform the ebeam lithography. In an exemplary embodiment, FIG. 4 is a cross-sectional schematic representation of an ebeam column of an electron beam lithography apparatus.

Figure 4:
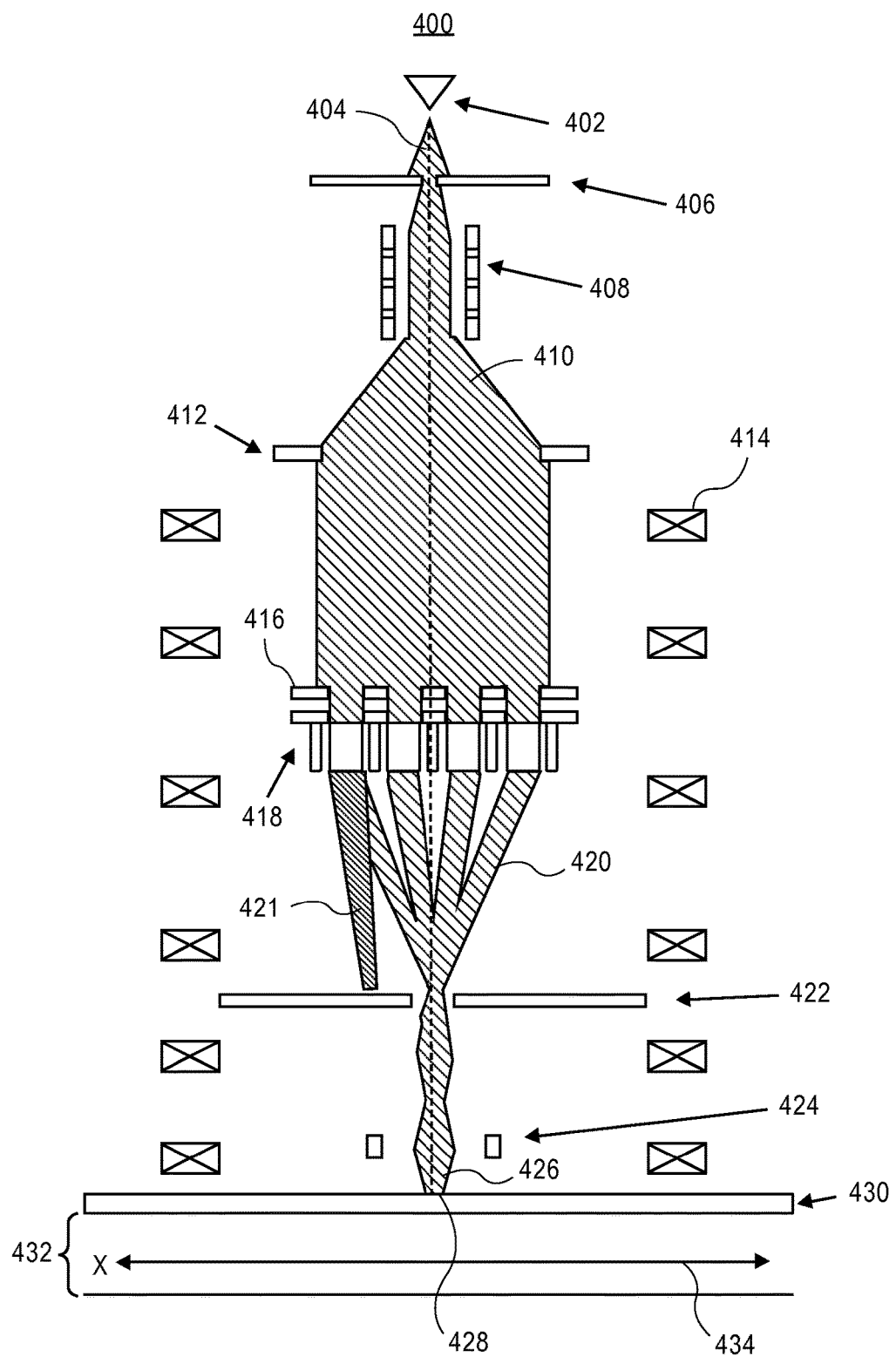
FIG. 4 is a cross-sectional schematic representation of an ebeam column of an electron beam lithography apparatus.

Referring to FIG. 4, an ebeam column 400 includes an electron source 402 for providing a beam of electrons 404. The beam of electrons 404 is passed through a limiting aperture 406 and, subsequently, through high aspect ratio illumination optics 408. The outgoing beam 410 is then passed through a slit 412 and may be controlled by a slim lens 414, e.g., which may be magnetic. Ultimately, the beam 404 is passed through a shaping aperture 416 (which may be a one-dimensional (1-D) shaping aperture) and then through a blanker aperture array (BAA) 418. The BAA 418 includes a plurality of physical apertures therein, such as openings formed in a thin slice of silicon. It may be the case that only a portion of the BAA 418 is exposed to the ebeam at a given time. Alternatively, or in conjunction, only a portion 420 of the ebeam 404 that passes through the BAA 418 is allowed to pass through a final aperture 422 (e.g., beam portion 421 is shown as blocked) and, possibly, a stage feedback deflector 424.

Referring again to FIG. 4, the resulting ebeam 426 ultimately impinges as a spot 428 on a surface of a wafer 430, such as a silicon wafer used in IC manufacture. Specifically, the resulting ebeam may impinge on a photoresist layer on the wafer, but embodiments are not so limited. A stage scan 432 moves the wafer 430 relative to the beam 426 along the direction of the arrow 434 shown in FIG. 4. It is to be appreciated that an ebeam tool in its entirely may include numerous columns 400 of the type depicted in FIG. 4. Also, as described in some embodiments below, the ebeam tool may have an associated base computer, and each column may further have a corresponding column computer.

One drawback of state-of-the-art e-beam lithography is that it is not readily adoptable into a high volume manufacturing (HVM) environment for advanced integrated circuit manufacturing. Today's e-beam tooling and associated methodology has proven to be too slow with respect to throughput requirements for HVM wafer processing. Embodiments described herein are directed to enabling the use of EBL in an HVM environment. In particular, many embodiments described herein enable improved throughput in an EBL tool to allow for the use of EBL in an HVM environment.

It is to be appreciated that when referring to openings or apertures in a blanker aperture array (BAA), all or some of the openings or apertures of the BAA can be switched open or "closed" (e.g., by beam deflecting) as the wafer/die moves underneath along a wafer travel or scan direction. In one embodiment, the BAA can be independently controlled as to whether each opening passes the ebeam through to the sample or deflects the beam into, e.g., a Faraday cup or blanking aperture. The ebeam column or apparatus including such a BAA may be built to deflect the overall beam coverage to just a portion of the BAA, and then individual openings in the BAA are electrically configured to pass the ebeam ("on") or not pass ("off"). For example, un-deflected electrons pass through to the wafer and expose a resist layer, while deflected electrons are caught in the Faraday cup or blanking aperture. It is to be appreciated that reference to "openings" or "opening heights" refers to the spot size impinged on the receiving wafer and not to the physical opening in the BAA since the physical openings are substantially larger (e.g., micron scale) than the spot size (e.g., nanometer scale) ultimately generated from the BAA. Thus, when described herein as the pitch of a BAA or column of openings in a BAA being said to "correspond" to the pitch of metal lines, such description actually refers to the relationship between pitch of the impinging spots as generated from the BAA and the pitch of the lines being cut.

It is also to be appreciated that, in some embodiments, an ebeam column as described above may also include other features in addition to those described in association with FIG. 4. For example, in an embodiment, the sample stage can be rotated by 90 degrees to accommodate alternating metallization layers which may be printed orthogonally to one another (e.g., rotated between X and Y scanning directions). In another embodiment, an e-beam tool is capable of rotating a wafer by 90 degrees prior to loading the wafer on the stage.

In accordance with an embodiment of the present invention, an underlying absorbing and/or conducting layer is implemented for ebeam direct write (EBDW) lithography. To provide context, in e-beam direct write (EBDW), a critical phenomenon affecting patterning performance is the backscatter (BS) of electrons off of the substrate and conventional underlying layers. The backscattered electrons can degrade resolution and exposure latitude of the e-beam lithography process. Secondary electrons may also have an impact. To address such issues, one or more embodiments are directed to the use of one or more underlayers that reduce the absorption of the backscattered electrons into the photoresist by either absorption of the backscattered electrons or conduction of electrons away from the e-beam photoresist.

It is to be appreciated that previous solutions provide for compensating for the effects of this phenomena, as opposed to reducing or changing it.

Figure 5:
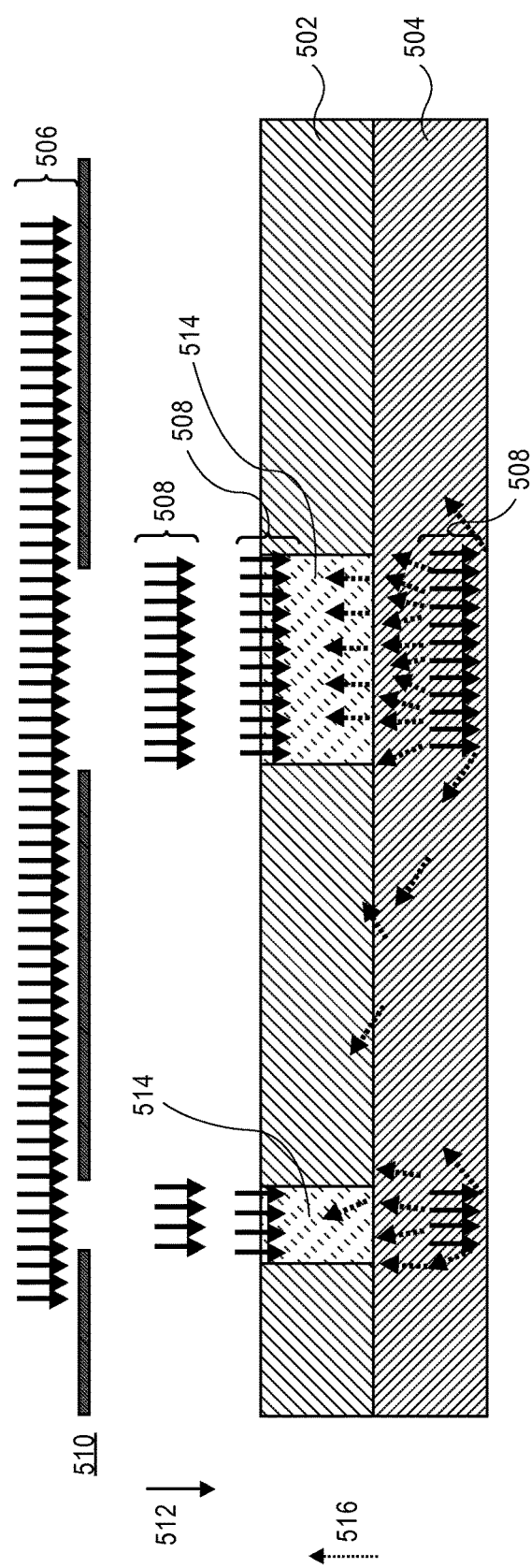
FIG. 5 illustrates the effect of backscattered electrons, demonstrating the issues that provide a background for embodiments of the present invention.

FIG. 5 illustrates the effect of backscattered electrons, demonstrating the issues that provide a background for embodiments of the present invention. Referring to FIG. 5, a resist layer 502 is formed on a conventional underlying layer 504 (e.g., a layer of material included in a semiconductor structure, such as, but not limited to, a hardmask layer formed above a metallization structure). An e-beam column provides a plurality of electrons 506, a portion 508 of which is permitted to pass through an aperture 510. The electrons that initially impinge on the resist are referred to as forward electrons, as referenced by arrow 512. The portion 508 of forward electrons permitted through apertures 510 provides exposed regions 514 of the resist layer 502. The portion 508 of forward electrons permitted through apertures 510 can further proceed through the resist layer 502 and into the underlying layer 504, as is depicted in FIG. 5. Referring again to FIG. 5, backscattered electrons 516 from a conventional underlayer result in a direct-current-like phenomenon exposure thereby reducing the sharpness of the aerial image defined by the incident electron beam. That is, the back scattered electrons can lead to a lower image contrast in the exposed resist layer 502.

Figure 6:
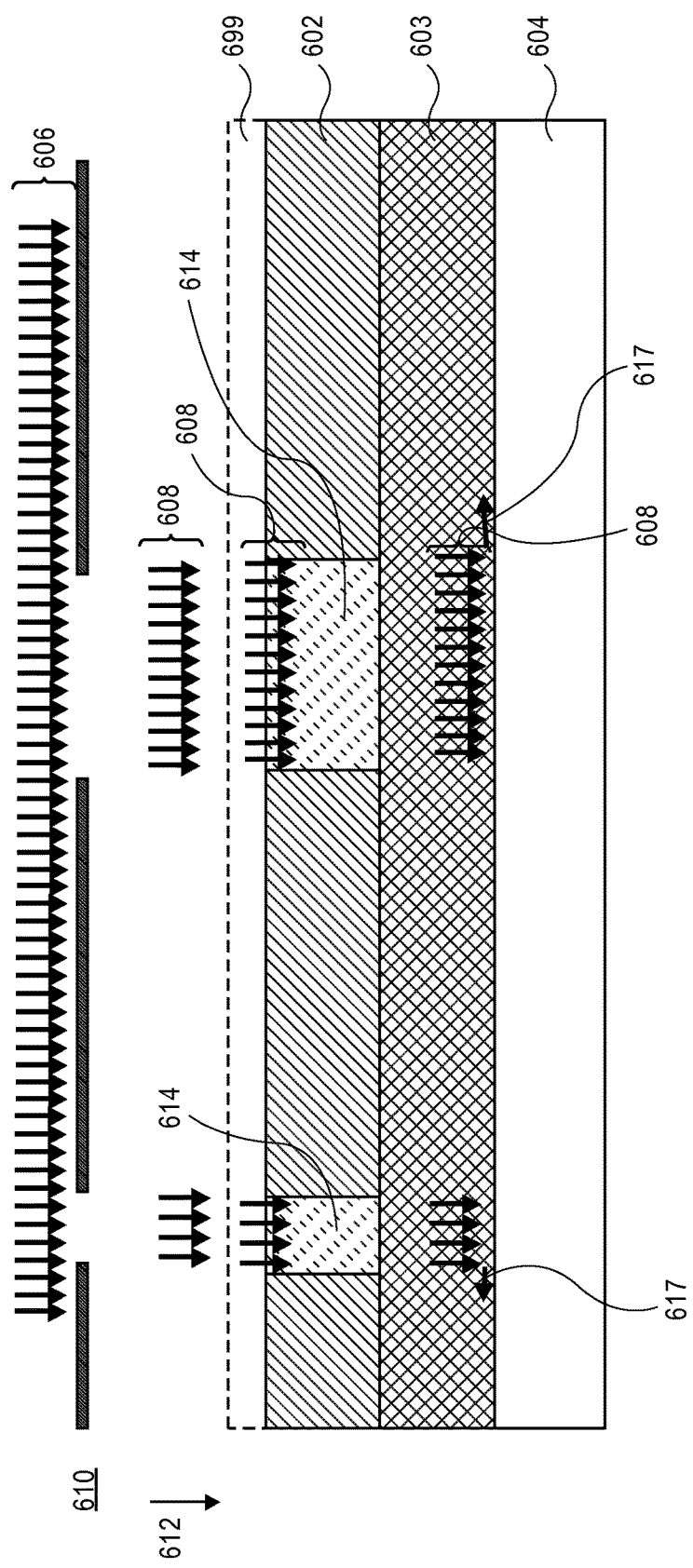
FIG. 6 illustrates advantages of using an absorbing and/or conducting underlayer for EBDW lithography, in accordance with an embodiment of the present invention.

As an example of advantages of implementing concepts described herein, FIG. 6 illustrates the beneficial use of an absorbing and/or conducting underlayer for EBDW lithography, in accordance with an embodiment of the present invention. Referring to FIG. 6, a resist layer 602 is formed on an underlying absorbing or conducting layer 603. The underlying absorbing or conducting layer 603 is formed on a conventional underlying layer 604 (e.g., a layer of material included in a semiconductor structure, such as, but not limited to, a hardmask layer formed above a metallization structure). An e-beam column provides a plurality of electrons 606, a portion 608 of which is permitted to pass through an aperture 610. The electrons that initially impinge on the resist 602 are referred to as forward electrons, as referenced by arrow 612. The portion 608 of forward electrons permitted through apertures 610 provides exposed regions 614 of the resist layer 602. The portion 608 of forward electrons permitted through apertures 610 can further proceed through the resist layer 602 and into the underlying absorbing or conducting layer 603, as is depicted in FIG. 6.

Referring to FIG. 6, by using a suitable underlying absorbing and/or conducting layer or combination of absorbing and/or conducting underlayers which can either absorb, reflect (inelastic and elastic backscatter) or conduct the incident electrons away instead of backscattering them, the impact of the backscattered electrons is reduced. In a particular example, the electrons are directed away from their initial location of incidence, as is indicated by the arrows 617. As a result, the image contrast is increased, improving exposure latitude. Furthermore, improved critical dimension (CD) uniformity and a higher resolution may be achieved for the exposure.

It is to be appreciated that one or more phenomena may be exploited when using underlayers to enhance e-beam patterning. In an embodiment, referring again to FIG. 6, the underlying layer 603 is an absorbing layer or a conducting layer, or both a conducting layer and an absorbing layer. In one such embodiment, the underlying layer 603 is an absorbing layer in that electrons impinging on the layer are ultimately absorbed at or near the location of impinging. In another embodiment, the underlying layer 603 is a conducting layer and directs impinging electrons along the layer, such as along the directions of the arrows 617. In another embodiment, the underlying layer 603 exhibits both absorbing (e.g., modulated by atomic number, Z) and conducting characteristics.

In an embodiment, the underlying layer 603 of FIG. 6 can represent a single layer or a stack of multiple layers. In the case of a stack of multiple layers, the stack may be made up of multiple absorbing layers, multiple conducting layers, or a combination of conducting and absorbing layers (such as alternating conducing and absorbing layers). It is to be appreciated that, regardless of the ultimate form of the underlying layer 603, the underlying layer 603 may be included in a stack of material layers (such as an underlying hardmask layer) that is etched upon development of the resist layer 602. The underlying layer 603 may be a sacrificial layer or stack of layers that is removed subsequent to a patterning process.

Thus, in an embodiment, a method of patterning a resist layer using an e-beam tool involves providing a wafer having a resist layer 602 on an underlying absorbing or conducting layer 603. Ebeam direct write lithography is performed to pattern the resist layer with incident electrons. The absorbing or conducting layer 603 absorbs, reflects or conducts a substantial portion of the incident electrons away from the resist layer 602 to diminish backscatter. In another embodiment, in the case that backscatter cannot be entirely reduced, the absorbing or conducting layer 603 can be used to tune the backscatter in such a way that any backscatter that is tolerated is controlled in such a way that high contrast is retained for image exposure. In one such embodiment, the backscatter may be conducted or reflected back toward the resist layer 602 from the absorbing or conducting layer 603, but in a fashion that is far less diffuse than conventional backscatter.

In an embodiment, the absorbing or conducting layer 603 is a material layer such as, but not limited to, a layer of chromium (Cr), a layer of molybdenum silicide (MoSi), a layer of titanium nitride (TiN), a layer of tantalum nitride (TaN), a layer of silicon (Si), a spin-on layer of carbon such as a layer of graphene, a CVD-deposited layer of carbon, a spin-on layer of glass, a layer of tungsten (W), a layer of copper (Cu), a layer of cobalt (Co), a layer of silicon nitride (SiN), a layer of silicon carbide (SiC), or a layer of silicon dioxide ($SiO_2$). In another embodiment, the absorbing or conducting layer 603 is a material layer such as, but not limited to, a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof. As described above, the absorbing or conducting layer 603 can be deposited as single layer or multiple layers. In yet another embodiment, the absorbing or conducting layer 603 is formed as a multilayer stack of layers sandwiched between layers of a dielectric material.

In an embodiment, the absorbing or conducting layer 603 is deposited using a technique such as spin-on, chemical vapor deposition (CVD), physical vapor deposition (PVD), electro deposition, sputtering, etc. In an embodiment, the absorbing or conducting layer 603 has a thickness approximately in the range of 1-200 nanometers. In a specific such embodiment, the absorbing or conducting layer 603 has a thickness approximately in the range of 20-50 nanometers. It is to be appreciated that other layers with other functions may also be included as additional underlayers under resist layer 602, such layers present to aid with patterning and planarization of resist 602. In an embodiment, resist layer 602 is a positive or negative tone resist, depending on the intended application.

Referring again to FIG. 6, in an embodiment, an upper charge dissipation layer 699 is included above resist layer 602. In one embodiment, upper charge dissipation layer 699 is a conducting layer. In a specific embodiment, the upper charge dissipation layer 699 is a conducting polymer material layer such as, but not limited to, a layer of polyphenylene, a layer of polypyrrole, a layer of polythiophene or a layer of polyaniline, such as doped polyaniline.

In an exemplary embodiment, ebeam conditions used to pattern resist layer 602 are approximately in the range of 10 kEV to 200 kEV or higher. The ebeam can be a shaped (e.g., using an aperture) or a Gaussian beam. The currents may range from a few uC/cm$^2$ to hundreds of uC/cm$^2$. In a specific such embodiment, a resist 602 of thickness of approximately 50 nanometers is used, and is covered by a charge dissipation layer 699 having a thickness of approximately 50 nanometers. An underlayer 603 of titanium nitride (TiN) is included and has a thickness of approximately 25 nanometers. An ebeam at 50 kEV was used with a shaped aperture to print patterns on the resist 602 that varied in size from approximately 15 nanometers to 60 nanometers.

Figure 7A:
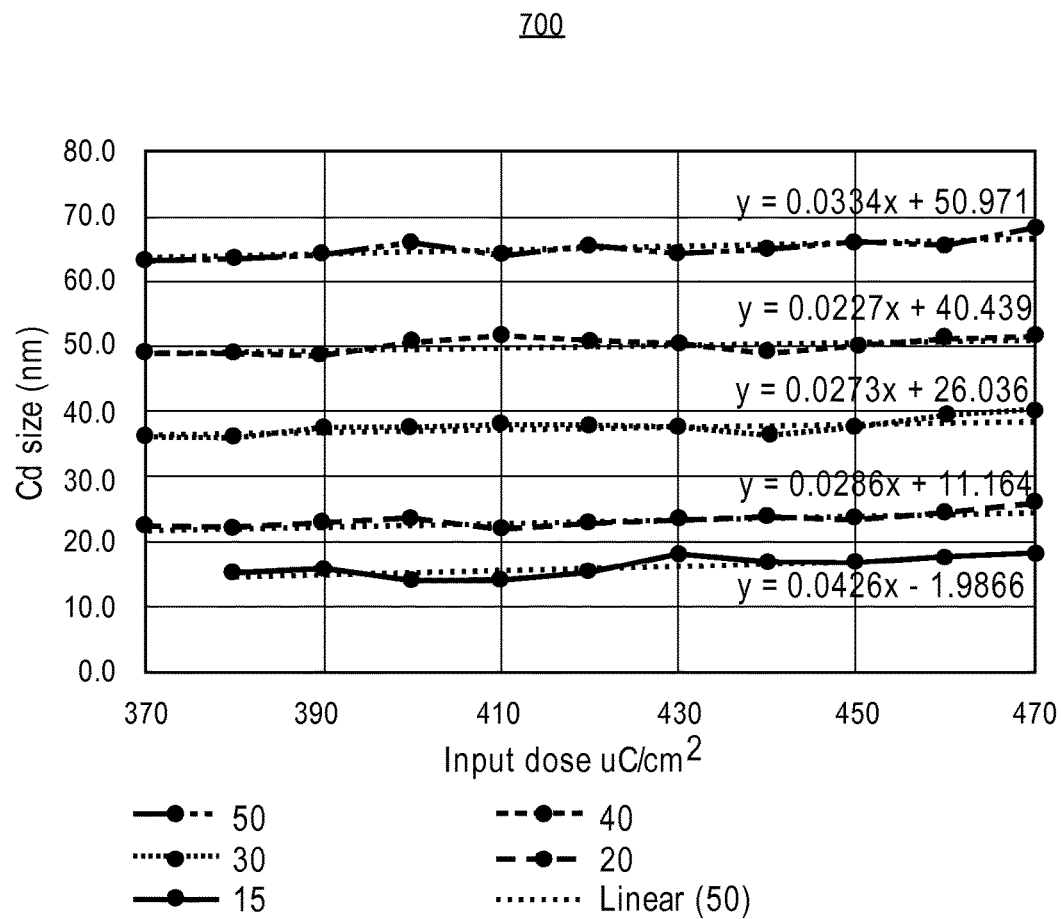
FIGS. 7A and 7B include graphs representing data collected on wafers patterned with underlying absorbing and/or conducting layers of metal (FIG. 7A), in accordance with an embodiment of the present invention, compared with wafers patterned without such layers for different aperture sizes (FIG. 7B).
Figure 7B:
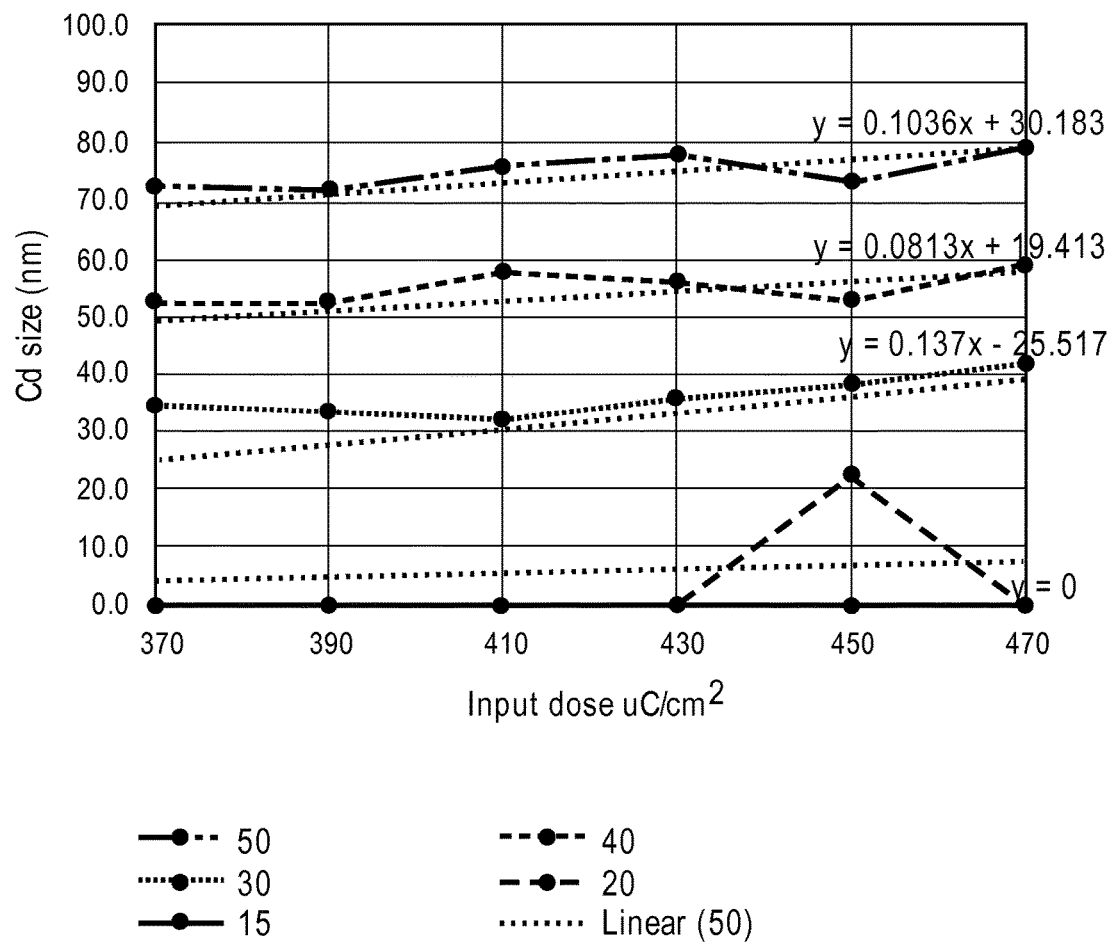

FIG. 7A is a graph 700 revealing data collected on wafers patterned with underlying absorbing and/or conducting layers of metal, in accordance with an embodiment of the present invention. By contrast, FIG. 7B is a graph 702 revealing data collected on wafers patterned without such absorbing and/or conducting layers. The data was collected for a variety of aperture sizes and is plotted as CD size as achieved on the wafer (in nanometers) as a function of dose (in C/cm$^2$). Referring collectively to FIGS. 7A and 7B, the wafers with underlying absorbing and/or conducting metal layers show a higher resolution (due to better contrast) and an improved dose latitude. Dose latitude is very important in order to prevent shot noise on the e-beam from causing CD variability.

It is to be appreciated that an underlying layer having different thermal and electrical conductivity can be evaluated in order to find the optimal combination for high resolution patterning using EBDW (e-beam direct write). Embodiments described herein can be implemented to enable design of a substrate in order to improve the resolution and dose latitude of the EBDW patterning process. Overall, improved resolution and less CD variation improves the feature density on the wafer and thus reduces the associated costs to manufacture chips.

Figure 8:
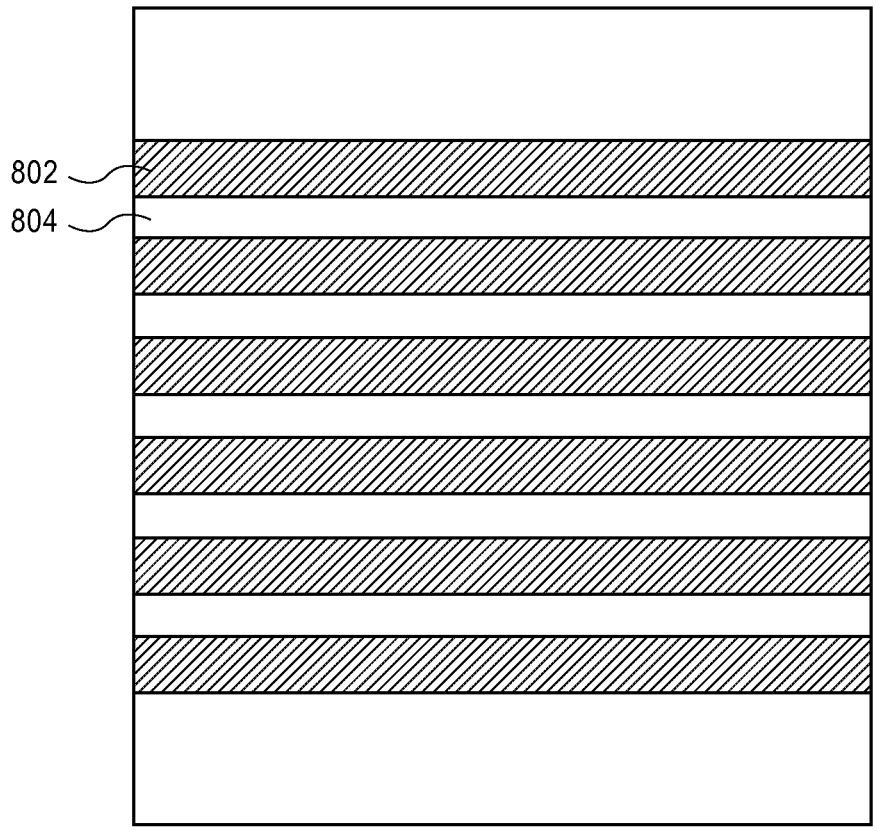
FIG. 8 illustrates a plan view and corresponding cross-sectional view of a previous layer metallization structure, in accordance with an embodiment of the present invention.
Figure 8:
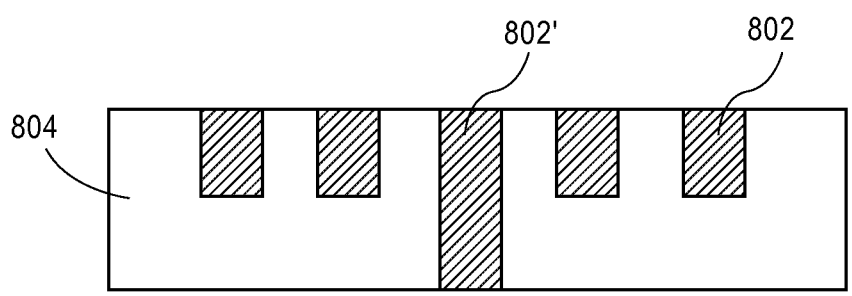

More generally, referring to all of the above aspects of embodiments of the present invention, it is to be appreciated that a metallization layer having lines with line cuts (or plugs) and having associated vias may be fabricated above a substrate and, in one embodiment, may be fabricated above a previous metallization layer. As an example, FIG. 8 illustrates a plan view and corresponding cross-sectional view of a previous layer metallization structure, in accordance with an embodiment of the present invention. Referring to FIG. 8, a starting structure 800 includes a pattern of metal lines 802 and interlayer dielectric (ILD) lines 804. The starting structure 800 may be patterned in a grating-like pattern with metal lines spaced at a constant pitch and having a constant width, as is depicted in FIG. 8. Although not shown, the lines 802 may have interruptions (i.e., cuts or plugs) at various locations along the lines. The pattern, for example, may be fabricated by a pitch halving or pitch quartering approach, as described above. Some of the lines may be associated with underlying vias, such as line 802' shown as an example in the cross-sectional view.

In an embodiment, fabrication of a metallization layer on the previous metallization structure of FIG. 8 begins with formation of an interlayer dielectric (ILD) material above the structure 800. A hardmask material layer may then be formed on the ILD layer. The hardmask material layer may be patterned to form a grating of unidirectional lines orthogonal to the lines 802 of 800. In one embodiment, the grating of unidirectional hardmask lines is fabricated using conventional lithography (e.g., photoresist and other associated layers) and may have a line density defined by a pitch-halving, pitch-quartering etc. approach as described above. The grating of hardmask lines leaves exposed a grating region of the underlying ILD layer. It is these exposed portions of the ILD layer that are ultimately patterned for metal line formation, via formation, and plug formation. For example, in an embodiment, via locations are patterned in regions of the exposed ILD using EBL as described above. The patterning may involve formation of a resist layer and patterning of the resist layer by EBL to provide via opening locations which may be etched into the ILD regions. The lines of overlying hardmask can be used to confine the vias to only regions of the exposed ILD, with overlap accommodated by the hardmask lines which can effectively be used as an etch stop. Plug (or cut) locations may also be patterned in exposed regions of the ILD, as confined by the overlying hardmask lines, in a separate EBL processing operation. The fabrication of cuts or plugs effectively preserve regions of ILD that will ultimately interrupt metal lines fabricated therein. Metal lines may then be fabricated using a damascene approach, where exposed portions of the ILD (those portions between the hardmask lines and not protected by a plug preservation layer, such as a resist layer patterned during "cutting") are partially recessed. The recessing may further extend the via locations to open metal lines from the underlying metallization structure. The partially recessed ILD regions are then filled with metal (a process which may also involve filling the via locations), e.g., by plating and CMP processing, to provide metal lines between the overlying hardmask lines. The hardmask lines may ultimately be removed for completion of a metallization structure. It is to be appreciated that the above ordering of line cuts, via formation, and ultimate line formation is provided only as an example. A variety of processing schemes may be accommodated using EBL cuts and vias, as described herein.

In an embodiment, as used throughout the present description, interlayer dielectric (ILD) material is composed of or includes a layer of a dielectric or insulating material. Examples of suitable dielectric materials include, but are not limited to, oxides of silicon (e.g., silicon dioxide (SiO$_2$)), doped oxides of silicon, fluorinated oxides of silicon, carbon doped oxides of silicon, various low-k dielectric materials known in the arts, and combinations thereof. The interlayer dielectric material may be formed by conventional techniques, such as, for example, chemical vapor deposition (CVD), physical vapor deposition (PVD), or by other deposition methods.

In an embodiment, as is also used throughout the present description, interconnect material is composed of one or more metal or other conductive structures. A common example is the use of copper lines and structures that may or may not include barrier layers between the copper and surrounding ILD material. As used herein, the term metal includes alloys, stacks, and other combinations of multiple metals. For example, the metal interconnect lines may include barrier layers, stacks of different metals or alloys, etc. The interconnect lines are also sometimes referred to in the arts as traces, wires, lines, metal, or simply interconnect.

In an embodiment, as is also used throughout the present description, hardmask materials are composed of dielectric materials different from the interlayer dielectric material. In some embodiments, a hardmask layer includes a layer of a nitride of silicon (e.g., silicon nitride) or a layer of an oxide of silicon, or both, or a combination thereof. Other suitable materials may include carbon-based materials. In another embodiment, a hardmask material includes a metal species. For example, a hardmask or other overlying material may include a layer of a nitride of titanium or another metal (e.g., titanium nitride). Potentially lesser amounts of other materials, such as dopants or surface oxidation, may be included in one or more of these layers. Alternatively, other hardmask layers known in the arts may be used depending upon the particular implementation. The hardmask layers maybe formed by ALD, CVD, PVD, or by other deposition methods.

It is to be appreciated that the layers and materials described in association with FIG. 8 are typically formed on or above an underlying semiconductor substrate or structure, such as underlying device layer(s) of an integrated circuit. In an embodiment, an underlying semiconductor substrate represents a general workpiece object used to manufacture integrated circuits. The semiconductor substrate often includes a wafer or other piece of silicon or another semiconductor material. Suitable semiconductor substrates include, but are not limited to, single crystal silicon, polycrystalline silicon and silicon on insulator (SOI), as well as similar substrates formed of other semiconductor materials. The semiconductor substrate, depending on the stage of manufacture, often includes transistors, integrated circuitry, and the like. The substrate may also include semiconductor materials, metals, dielectrics, dopants, and other materials commonly found in semiconductor substrates. Furthermore, the structure depicted in FIG. 8 may be fabricated on underlying lower level interconnect layers.

In another embodiment, EBL cuts may be used to fabricate semiconductor devices, such as PMOS or NMOS devices of an integrated circuit. In one such embodiment, EBL cuts are used to pattern a grating of active regions that are ultimately used to form fin-based or trigate structures. In another such embodiment, EBL cuts are used to pattern a gate layer, such as a poly layer, ultimately used for gate electrode fabrication. As an example of a completed device, FIGS. 9A and 9B illustrate a cross-sectional view and a plan view (taken along the a-a' axis of the cross-sectional view), respectively, of a non-planar semiconductor device having a plurality of fins, in accordance with an embodiment of the present invention.

Figure 9A:
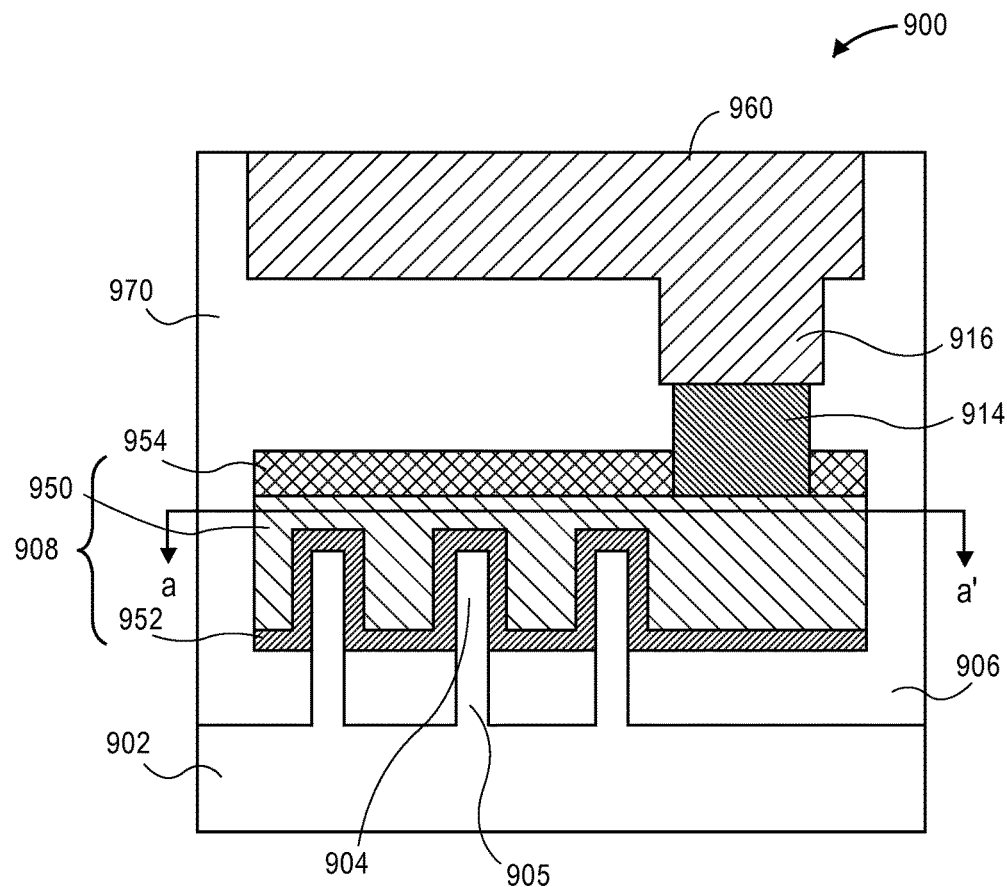
FIG. 9A illustrates a cross-sectional view of a non-planar semiconductor device having fins, in accordance with an embodiment of the present invention.

Referring to FIG. 9A, a semiconductor structure or device 900 includes a non-planar active region (e.g., a fin structure including protruding fin portion 904 and sub-fin region 905) formed from substrate 902, and within isolation region 906. A gate line 908 is disposed over the protruding portions 904 of the non-planar active region as well as over a portion of the isolation region 906. As shown, gate line 908 includes a gate electrode 950 and a gate dielectric layer 952. In one embodiment, gate line 908 may also include a dielectric cap layer 954. A gate contact 914, and overlying gate contact via 916 are also seen from this perspective, along with an overlying metal interconnect 960, all of which are disposed in inter-layer dielectric stacks or layers 970. Also seen from the perspective of FIG. 9A, the gate contact 914 is, in one embodiment, disposed over isolation region 906, but not over the non-planar active regions.

Figure 9B:
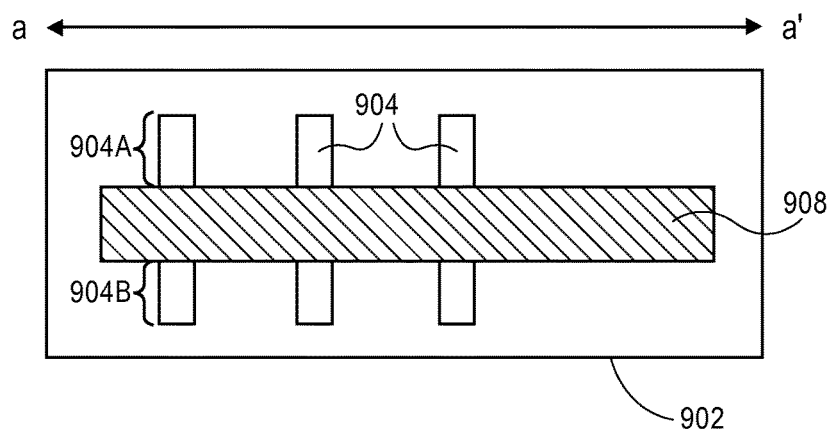
FIG. 9B illustrates a plan view taken along the a-a' axis of the semiconductor device of FIG. 9A, in accordance with an embodiment of the present invention.

Referring to FIG. 9B, the gate line 908 is shown as disposed over the protruding fin portions 904. Source and drain regions 904A and 904B of the protruding fin portions 904 can be seen from this perspective. In one embodiment, the source and drain regions 904A and 904B are doped portions of original material of the protruding fin portions 904. In another embodiment, the material of the protruding fin portions 904 is removed and replaced with another semiconductor material, e.g., by epitaxial deposition. In either case, the source and drain regions 904A and 904B may extend below the height of dielectric layer 906, i.e., into the sub-fin region 905.

In an embodiment, the semiconductor structure or device 900 is a non-planar device such as, but not limited to, a fin-FET or a tri-gate device. In such an embodiment, a corresponding semiconducting channel region is composed of or is formed in a three-dimensional body. In one such embodiment, the gate electrode stacks of gate lines 908 surround at least a top surface and a pair of sidewalls of the three-dimensional body.

Embodiments disclosed herein may be used to manufacture a wide variety of different types of integrated circuits and/or microelectronic devices. Examples of such integrated circuits include, but are not limited to, processors, chipset components, graphics processors, digital signal processors, micro-controllers, and the like. In other embodiments, semiconductor memory may be manufactured. Moreover, the integrated circuits or other microelectronic devices may be used in a wide variety of electronic devices known in the arts. For example, in computer systems (e.g., desktop, laptop, server), cellular phones, personal electronics, etc. The integrated circuits may be coupled with a bus and other components in the systems. For example, a processor may be coupled by one or more buses to a memory, a chipset, etc. Each of the processor, the memory, and the chipset, may potentially be manufactured using the approaches disclosed herein.

Figure 10:
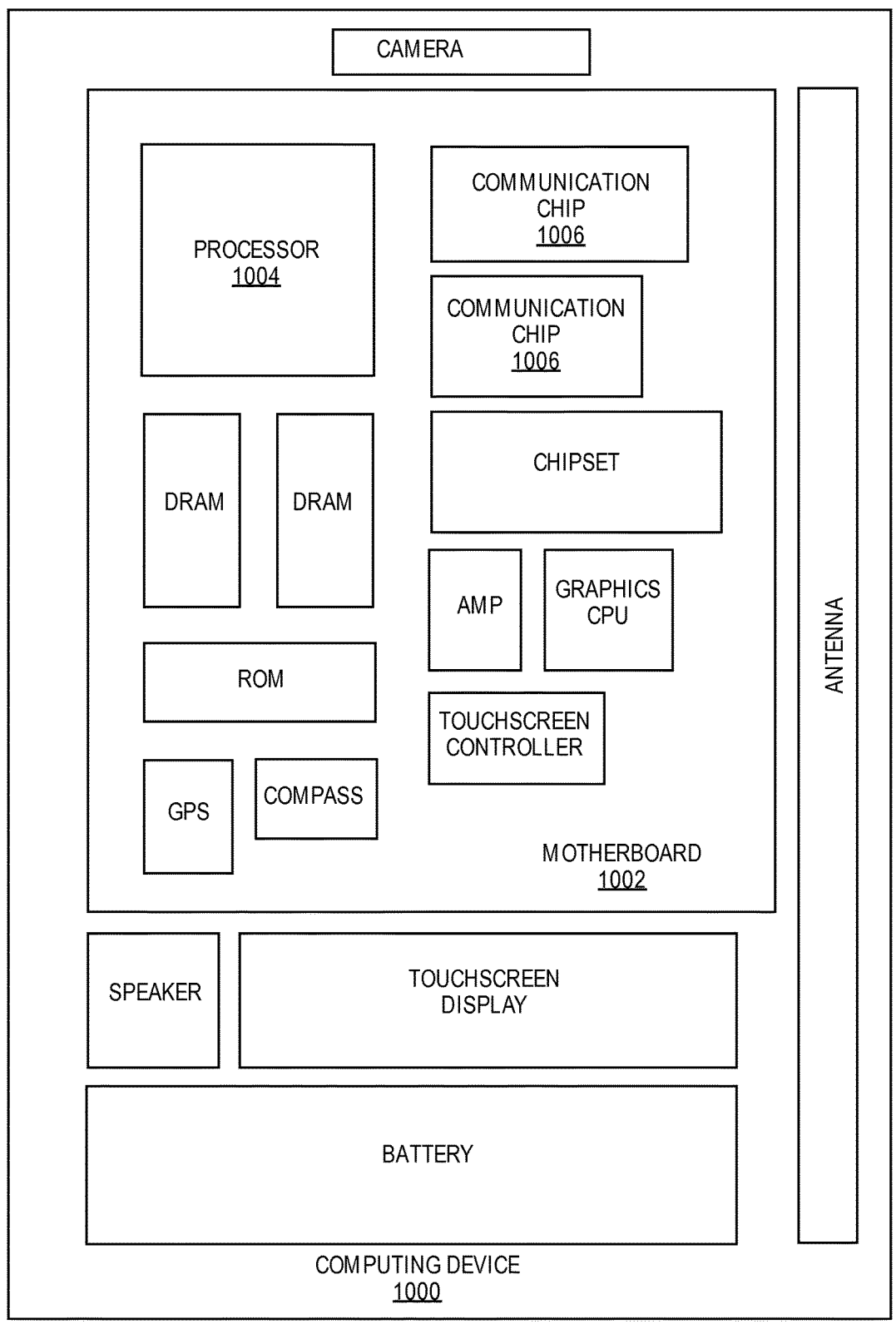
FIG. 10 illustrates a computing device in accordance with one implementation of the invention.

FIG. 10 illustrates a computing device 1000 in accordance with one implementation of the invention. The computing device 1000 houses a board 1002. The board 1002 may include a number of components, including but not limited to a processor 1004 and at least one communication chip 1006. The processor 1004 is physically and electrically coupled to the board 1002. In some implementations the at least one communication chip 1006 is also physically and electrically coupled to the board 1002. In further implementations, the communication chip 1006 is part of the processor 1004.

Depending on its applications, computing device 1000 may include other components that may or may not be physically and electrically coupled to the board 1002. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 1006 enables wireless communications for the transfer of data to and from the computing device 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing device 1000 includes an integrated circuit die packaged within the processor 1004. In some implementations of the invention, the integrated circuit die of the processor includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 1006 also includes an integrated circuit die packaged within the communication chip 1006. In accordance with another implementation of embodiments of the invention, the integrated circuit die of the communication chip includes one or more structures fabricated using CEBL, in accordance with implementations of embodiments of the invention.

In further implementations, another component housed within the computing device 1000 may contain an integrated circuit die that includes one or more structures fabricated using CEBL, in accordance with implementations of embodiments of the invention.

In various implementations, the computing device 1000 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1000 may be any other electronic device that processes data.

Embodiments of the present invention may be provided as a computer program product, or software, that may include a machine-readable medium having stored thereon instructions, which may be used to program a computer system (or other electronic devices) to perform a process according to embodiments of the present invention. In one embodiment, the computer system is coupled with an ebeam tool such as described in association with FIG. 4. A machine-readable medium includes any mechanism for storing or transmitting information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices, etc.), a machine (e.g., computer) readable transmission medium (electrical, optical, acoustical or other form of propagated signals (e.g., infrared signals, digital signals, etc.)), etc.

Figure 11:
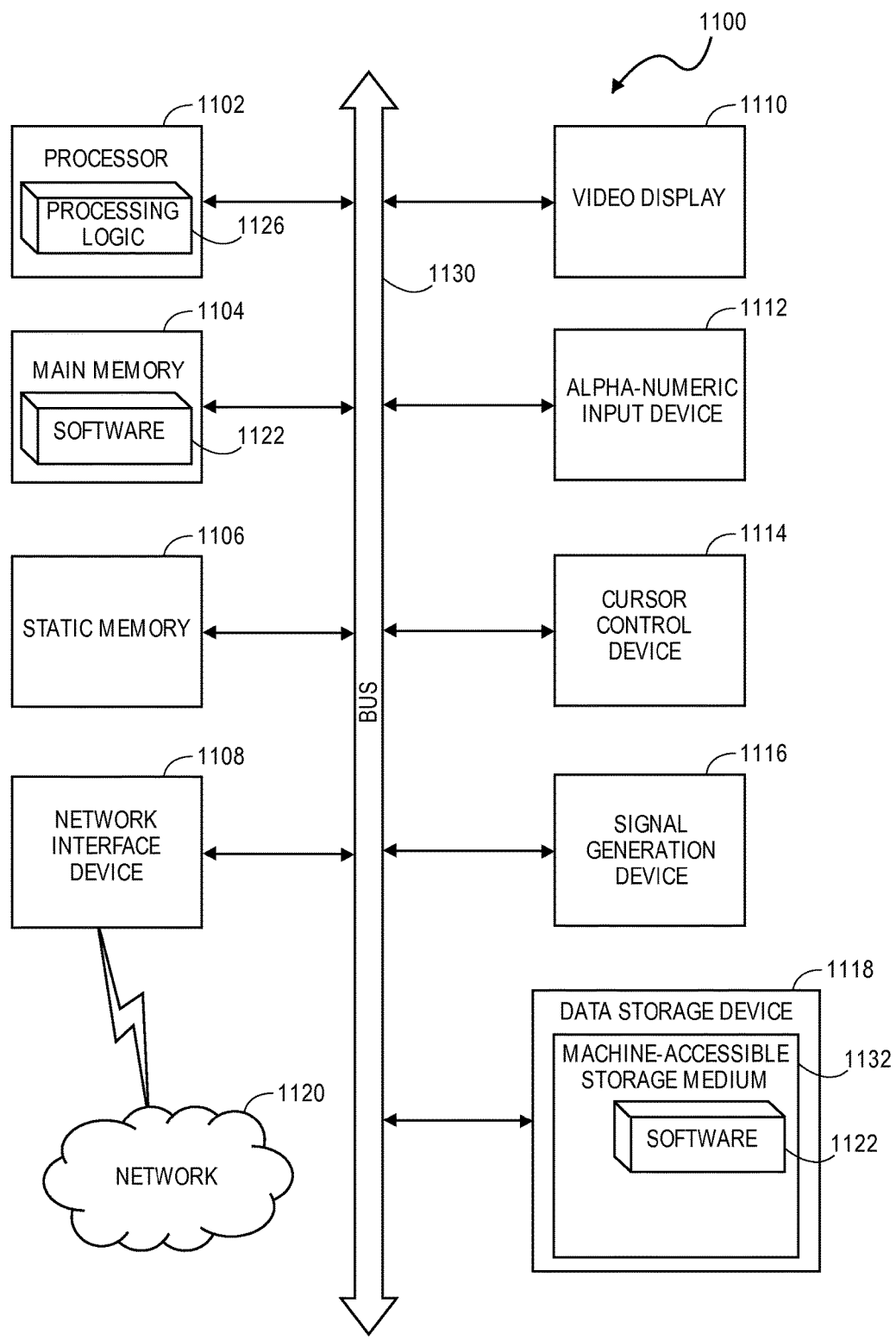
FIG. 11 illustrates a block diagram of an exemplary computer system, in accordance with an embodiment of the present invention.

FIG. 11 illustrates a diagrammatic representation of a machine in the exemplary form of a computer system 1100 within which a set of instructions, for causing the machine to perform any one or more of the methodologies described herein (such as end-point detection), may be executed. In alternative embodiments, the machine may be connected (e.g., networked) to other machines in a Local Area Network (LAN), an intranet, an extranet, or the Internet. The machine may operate in the capacity of a server or a client machine in a client-server network environment, or as a peer machine in a peer-to-peer (or distributed) network environment. The machine may be a personal computer (PC), a tablet PC, a set-top box (STB), a Personal Digital Assistant (PDA), a cellular telephone, a web appliance, a server, a network router, switch or bridge, or any machine capable of executing a set of instructions (sequential or otherwise) that specify actions to be taken by that machine. Further, while only a single machine is illustrated, the term "machine" shall also be taken to include any collection of machines (e.g., computers) that individually or jointly execute a set (or multiple sets) of instructions to perform any one or more of the methodologies described herein.

The exemplary computer system 1100 includes a processor 1102, a main memory 1104 (e.g., read-only memory (ROM), flash memory, dynamic random access memory (DRAM) such as synchronous DRAM (SDRAM) or Rambus DRAM (RDRAM), etc.), a static memory 1106 (e.g., flash memory, static random access memory (SRAM), etc.), and a secondary memory 1118 (e.g., a data storage device), which communicate with each other via a bus 1130.

Processor 1102 represents one or more general-purpose processing devices such as a microprocessor, central processing unit, or the like. More particularly, the processor 1102 may be a complex instruction set computing (CISC) microprocessor, reduced instruction set computing (RISC) microprocessor, very long instruction word (VLIW) microprocessor, processor implementing other instruction sets, or processors implementing a combination of instruction sets. Processor 1102 may also be one or more special-purpose processing devices such as an application specific integrated circuit (ASIC), a field programmable gate array (FPGA), a digital signal processor (DSP), network processor, or the like. Processor 1102 is configured to execute the processing logic 1126 for performing the operations described herein.

The computer system 1100 may further include a network interface device 1108. The computer system 1100 also may include a video display unit 1110 (e.g., a liquid crystal display (LCD), a light emitting diode display (LED), or a cathode ray tube (CRT)), an alphanumeric input device 1112 (e.g., a keyboard), a cursor control device 1114 (e.g., a mouse), and a signal generation device 1116 (e.g., a speaker).

The secondary memory 1118 may include a machine-accessible storage medium (or more specifically a computer-readable storage medium) 1132 on which is stored one or more sets of instructions (e.g., software 1122) embodying any one or more of the methodologies or functions described herein. The software 1122 may also reside, completely or at least partially, within the main memory 1104 and/or within the processor 1102 during execution thereof by the computer system 1100, the main memory 1104 and the processor 1102 also constituting machine-readable storage media. The software 1122 may further be transmitted or received over a network 1120 via the network interface device 1108.

While the machine-accessible storage medium 1132 is shown in an exemplary embodiment to be a single medium, the term "machine-readable storage medium" should be taken to include a single medium or multiple media (e.g., a centralized or distributed database, and/or associated caches and servers) that store the one or more sets of instructions. The term "machine-readable storage medium" shall also be taken to include any medium that is capable of storing or encoding a set of instructions for execution by the machine and that cause the machine to perform any one or more of the methodologies of the present invention. The term "machine-readable storage medium" shall accordingly be taken to include, but not be limited to, solid-state memories, and optical and magnetic media.

Implementations of embodiments of the invention may be formed or carried out on a substrate, such as a semiconductor substrate. In one implementation, the semiconductor substrate may be a crystalline substrate formed using a bulk silicon or a silicon-on-insulator substructure. In other implementations, the semiconductor substrate may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the spirit and scope of the present invention.

A plurality of transistors, such as metal-oxide-semiconductor field-effect transistors (MOSFET or simply MOS transistors), may be fabricated on the substrate. In various implementations of the invention, the MOS transistors may be planar transistors, nonplanar transistors, or a combination of both. Nonplanar transistors include FinFET transistors such as double-gate transistors and tri-gate transistors, and wrap-around or all-around gate transistors such as nanoribbon and nanowire transistors. Although the implementations described herein may illustrate only planar transistors, it should be noted that the invention may also be carried out using nonplanar transistors.

Each MOS transistor includes a gate stack formed of at least two layers, a gate dielectric layer and a gate electrode layer. The gate dielectric layer may include one layer or a stack of layers. The one or more layers may include silicon oxide, silicon dioxide ($SiO_2$) and/or a high-k dielectric material. The high-k dielectric material may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layer include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate. In some embodiments, an annealing process may be carried out on the gate dielectric layer to improve its quality when a high-k material is used.

The gate electrode layer is formed on the gate dielectric layer and may consist of at least one P-type workfunction metal or N-type workfunction metal, depending on whether the transistor is to be a PMOS or an NMOS transistor. In some implementations, the gate electrode layer may consist of a stack of two or more metal layers, where one or more metal layers are workfunction metal layers and at least one metal layer is a fill metal layer.

For a PMOS transistor, metals that may be used for the gate electrode include, but are not limited to, ruthenium, palladium, platinum, cobalt, nickel, and conductive metal oxides, e.g., ruthenium oxide. A P-type metal layer will enable the formation of a PMOS gate electrode with a workfunction that is between about 4.9 eV and about 5.2 eV. For an NMOS transistor, metals that may be used for the gate electrode include, but are not limited to, hafnium, zirconium, titanium, tantalum, aluminum, alloys of these metals, and carbides of these metals such as hafnium carbide, zirconium carbide, titanium carbide, tantalum carbide, and aluminum carbide. An N-type metal layer will enable the formation of an NMOS gate electrode with a workfunction that is between about 3.9 eV and about 4.2 eV.

In some implementations, the gate electrode may consist of a "U"-shaped structure that includes a bottom portion substantially parallel to the surface of the substrate and two sidewall portions that are substantially perpendicular to the top surface of the substrate. In another implementation, at least one of the metal layers that form the gate electrode may simply be a planar layer that is substantially parallel to the top surface of the substrate and does not include sidewall portions substantially perpendicular to the top surface of the substrate. In further implementations of the invention, the gate electrode may consist of a combination of U-shaped structures and planar, non-U-shaped structures. For example, the gate electrode may consist of one or more U-shaped metal layers formed atop one or more planar, non-U-shaped layers.

In some implementations of the invention, a pair of sidewall spacers may be formed on opposing sides of the gate stack that bracket the gate stack. The sidewall spacers may be formed from a material such as silicon nitride, silicon oxide, silicon carbide, silicon nitride doped with carbon, and silicon oxynitride. Processes for forming sidewall spacers are well known in the art and generally include deposition and etching process steps. In an alternate implementation, a plurality of spacer pairs may be used, for instance, two pairs, three pairs, or four pairs of sidewall spacers may be formed on opposing sides of the gate stack.

As is well known in the art, source and drain regions are formed within the substrate adjacent to the gate stack of each MOS transistor. The source and drain regions are generally formed using either an implantation/diffusion process or an etching/deposition process. In the former process, dopants such as boron, aluminum, antimony, phosphorous, or arsenic may be ion-implanted into the substrate to form the source and drain regions. An annealing process that activates the dopants and causes them to diffuse further into the substrate typically follows the ion implantation process. In the latter process, the substrate may first be etched to form recesses at the locations of the source and drain regions. An epitaxial deposition process may then be carried out to fill the recesses with material that is used to fabricate the source and drain regions. In some implementations, the source and drain regions may be fabricated using a silicon alloy such as silicon germanium or silicon carbide. In some implementations the epitaxially deposited silicon alloy may be doped in situ with dopants such as boron, arsenic, or phosphorous. In further embodiments, the source and drain regions may be formed using one or more alternate semiconductor materials such as germanium or a group III-V material or alloy. And in further embodiments, one or more layers of metal and/or metal alloys may be used to form the source and drain regions.

One or more interlayer dielectrics (ILD) are deposited over the MOS transistors. The ILD layers may be formed using dielectric materials known for their applicability in integrated circuit structures, such as low-k dielectric materials. Examples of dielectric materials that may be used include, but are not limited to, silicon dioxide ($SiO_2$), carbon doped oxide (CDO), silicon nitride, organic polymers such as perfluorocyclobutane or polytetrafluoroethylene, fluorosilicate glass (FSG), and organosilicates such as silsesquioxane, siloxane, or organosilicate glass. The ILD layers may include pores or air gaps to further reduce their dielectric constant.

Figure 12:
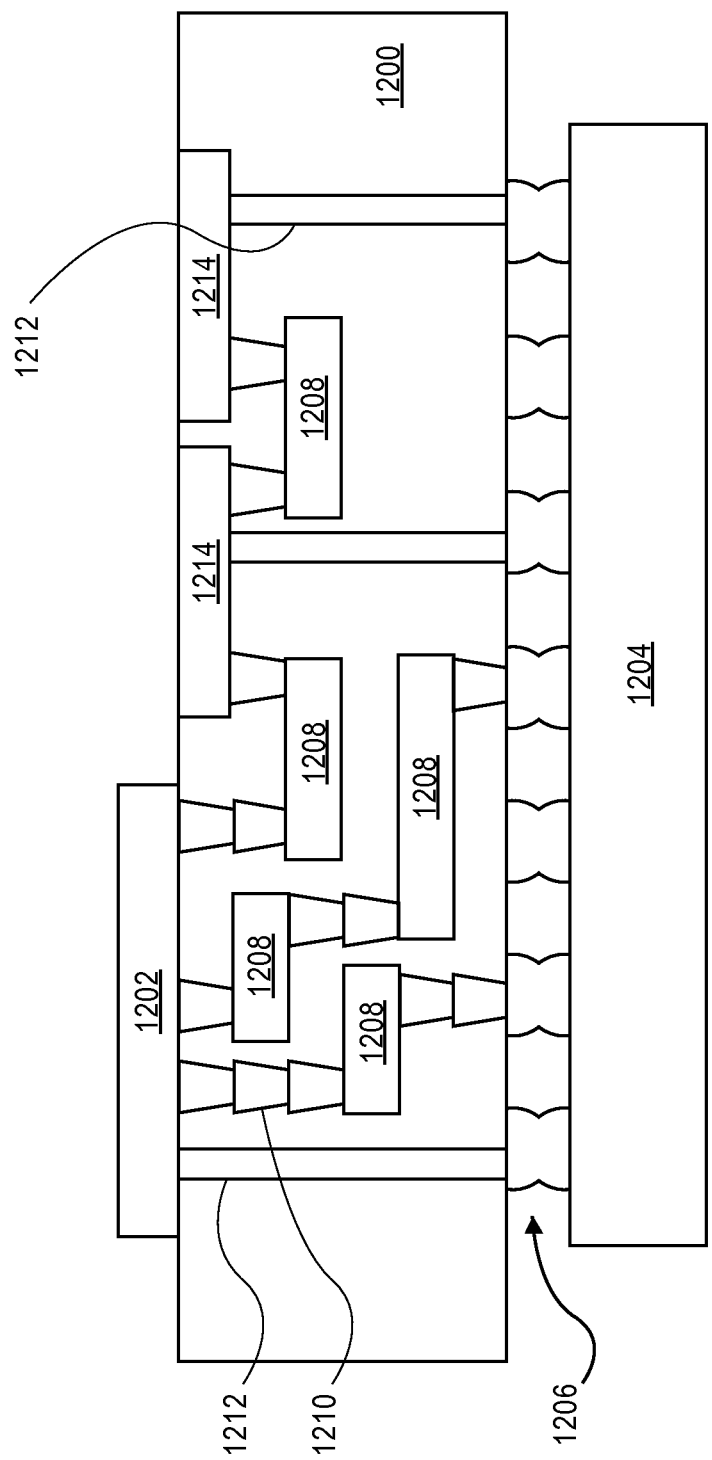
FIG. 12 is an interposer implementing one or more embodiments of the invention.

FIG. 12 illustrates an interposer 1200 that includes one or more embodiments of the invention. The interposer 1200 is an intervening substrate used to bridge a first substrate 1202 to a second substrate 1204. The first substrate 1202 may be, for instance, an integrated circuit die. The second substrate 1204 may be, for instance, a memory module, a computer motherboard, or another integrated circuit die. Generally, the purpose of an interposer 1200 is to spread a connection to a wider pitch or to reroute a connection to a different connection. For example, an interposer 1200 may couple an integrated circuit die to a ball grid array (BGA) 1206 that can subsequently be coupled to the second substrate 1204. In some embodiments, the first and second substrates 1202/1204 are attached to opposing sides of the interposer 1200. In other embodiments, the first and second substrates 1202/1204 are attached to the same side of the interposer 1200. And in further embodiments, three or more substrates are interconnected by way of the interposer 1200.

The interposer 1200 may be formed of an epoxy resin, a fiberglass-reinforced epoxy resin, a ceramic material, or a polymer material such as polyimide. In further implementations, the interposer may be formed of alternate rigid or flexible materials that may include the same materials described above for use in a semiconductor substrate, such as silicon, germanium, and other group III-V and group IV materials.

The interposer may include metal interconnects 1208 and vias 1210, including but not limited to through-silicon vias (TSVs) 1212. The interposer 1200 may further include embedded devices 1214, including both passive and active devices. Such devices include, but are not limited to, capacitors, decoupling capacitors, resistors, inductors, fuses, diodes, transformers, sensors, and electrostatic discharge (ESD) devices. More complex devices such as radio-frequency (RF) devices, power amplifiers, power management devices, antennas, arrays, sensors, and MEMS devices may also be formed on the interposer 1200.

In accordance with embodiments of the invention, apparatuses or processes disclosed herein may be used in the fabrication of interposer 1200.

Figure 13:
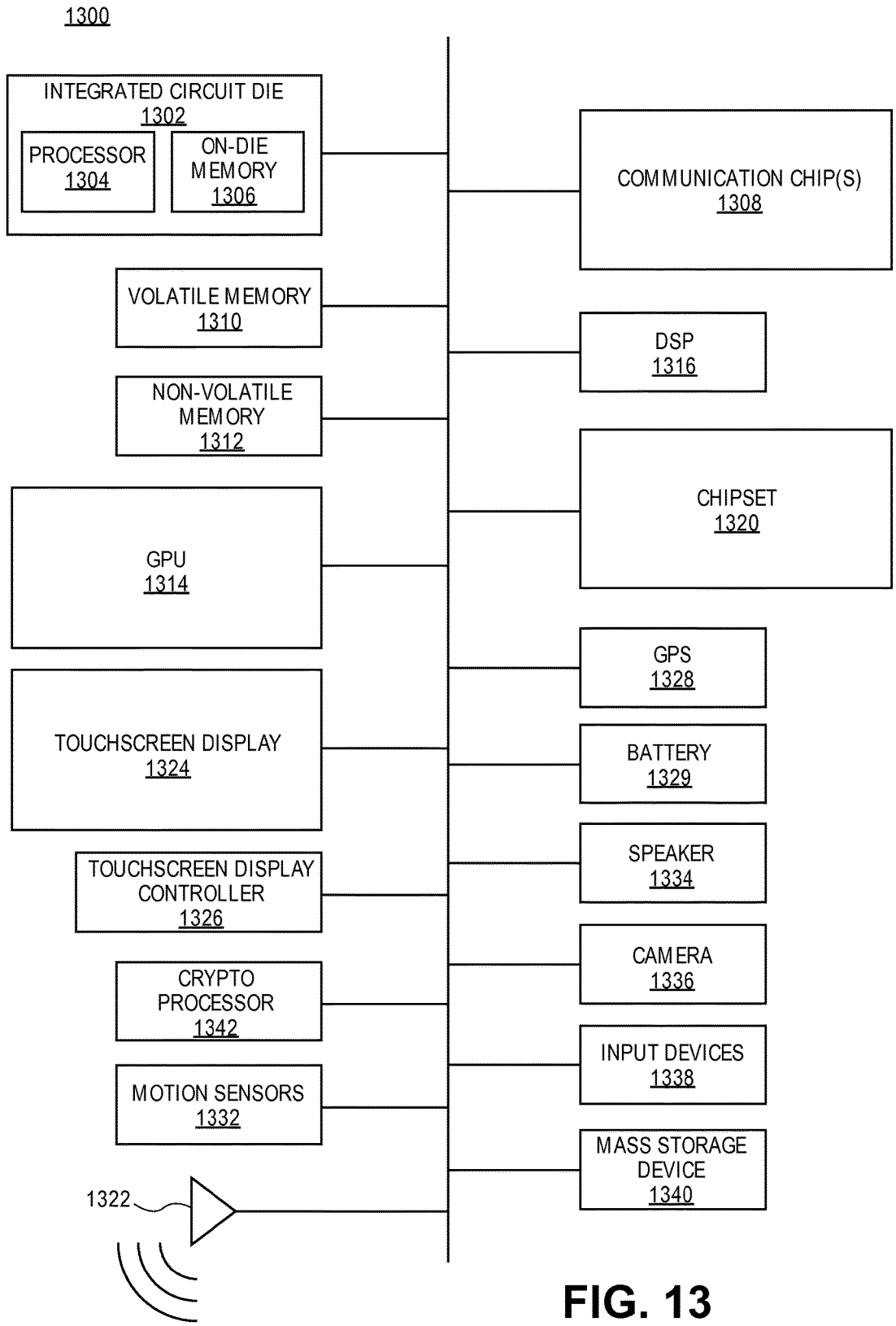
FIG. 13 is a computing device built in accordance with an embodiment of the invention.

FIG. 13 illustrates a computing device 1300 in accordance with one embodiment of the invention. The computing device 1300 may include a number of components. In one embodiment, these components are attached to one or more motherboards. In an alternate embodiment, these components are fabricated onto a single system-on-a-chip (SoC) die rather than a motherboard. The components in the computing device 1300 include, but are not limited to, an integrated circuit die 1302 and at least one communication chip 1308. In some implementations the communication chip 1308 is fabricated as part of the integrated circuit die 1302. The integrated circuit die 1302 may include a CPU 1304 as well as on-die memory 1306, often used as cache memory, that can be provided by technologies such as embedded DRAM (eDRAM) or spin-transfer torque memory (STTM or STTM-RAM).

Computing device 1300 may include other components that may or may not be physically and electrically coupled to the motherboard or fabricated within an SoC die. These other components include, but are not limited to, volatile memory 1310 (e.g., DRAM), non-volatile memory 1312 (e.g., ROM or flash memory), a graphics processing unit 1314 (GPU), a digital signal processor 1316, a crypto processor 1342 (a specialized processor that executes cryptographic algorithms within hardware), a chipset 1320, an antenna 1322, a display or a touchscreen display 4024, a touchscreen controller 1326, a battery 1329 or other power source, a power amplifier (not shown), a global positioning system (GPS) device 1328, a compass 1330, a motion coprocessor or sensors 1332 (that may include an accelerometer, a gyroscope, and a compass), a speaker 1334, a camera 1336, user input devices 1338 (such as a keyboard, mouse, stylus, and touchpad), and a mass storage device 1340 (such as hard disk drive, compact disk (CD), digital versatile disk (DVD), and so forth).

The communications chip 1308 enables wireless communications for the transfer of data to and from the computing device 1300. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1308 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 1300 may include a plurality of communication chips 1308. For instance, a first communication chip 1308 may be dedicated to shorter range wireless communications such as Wi-Fi and Bluetooth and a second communication chip 4008 may be dedicated to longer range wireless communications such as GPS, EDGE, GPRS, CDMA, WiMAX, LTE, Ev-DO, and others.

The processor 1304 of the computing device 1300 includes one or more structures fabricated using CEBL, in accordance with implementations of embodiments of the invention. The term "processor" may refer to any device or portion of a device that processes electronic data from registers and/or memory to transform that electronic data into other electronic data that may be stored in registers and/or memory.

The communication chip 1308 may also include one or more structures fabricated using CEBL, in accordance with implementations of embodiments of the invention.

In further embodiments, another component housed within the computing device 1300 may contain one or more structures fabricated using CEBL, in accordance with implementations of embodiments of the invention.

In various embodiments, the computing device 1300 may be a laptop computer, a netbook computer, a notebook computer, an ultrabook computer, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 1300 may be any other electronic device that processes data.

The above description of illustrated implementations of embodiments of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

In an embodiment, a method of patterning a resist layer using an e-beam tool includes providing a wafer having a resist layer on an underlying absorbing or conducting layer. The method also includes performing ebeam direct write lithography to pattern the resist layer with incident electrons. The absorbing or conducting layer absorbs, reflects or conducts away a substantial portion of the incident electrons to diminish backscatter.

In one embodiment, the underlying absorbing or conducting layer is a material layer selected from the group consisting of a layer of chromium (Cr), a layer of molybdenum silicide (MoSi), a layer of titanium nitride (TiN), a layer of tantalum nitride (TaN), a layer of silicon (Si), a spin-on layer of carbon such as a layer of graphene, a CVD-deposited layer of carbon, a spin-on layer of glass, a layer of tungsten (W), a layer of copper (Cu), a layer of cobalt (Co), a layer of silicon nitride (SiN), a layer of silicon carbide (SiC), and a layer of silicon dioxide (SiO$_2$).

In one embodiment, the underlying absorbing or conducting layer is a material layer selected from the group consisting of a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof.

In one embodiment, the underlying absorbing or conducting layer is a single material layer.

In one embodiment, the underlying absorbing or conducting layer is a stack of multiple material layers.

In one embodiment, the underlying absorbing or conducting layer has a thickness approximately in the range of 1-200 nanometers.

In one embodiment, the wafer is provided further having an upper charge dissipation layer disposed above the resist layer.

In one embodiment, the method further includes, subsequent to performing the ebeam direct write lithography, developing the resist layer and etching the absorbing or conducting layer and a layer below the absorbing or conducting layer.

In one embodiment, performing the ebeam direct write lithography comprises using an ebeam approximately in the range of 10 kEV to 200 kEV with a current approximately in the range of a few uC/cm$^2$ to hundreds of uC/cm$^2$.

In an embodiment, a method of patterning a resist layer using an e-beam tool includes providing a wafer having a resist layer on an underlying absorbing or conducting layer. The method also includes performing ebeam direct write lithography to pattern the resist layer with incident electrons. The absorbing or conducting layer absorbs, reflects or conducts a substantial portion of the incident electrons to tune backscatter.

In one embodiment, the underlying absorbing or conducting layer is a material layer selected from the group consisting of a layer of chromium (Cr), a layer of molybdenum silicide (MoSi), a layer of titanium nitride (TiN), a layer of tantalum nitride (TaN), a layer of silicon (Si), a spin-on layer of carbon such as a layer of graphene, a CVD-deposited layer of carbon, a spin-on layer of glass, a layer of tungsten (W), a layer of copper (Cu), a layer of cobalt (Co), a layer of silicon nitride (SiN), a layer of silicon carbide (SiC), and a layer of silicon dioxide (SiO$_2$).

In one embodiment, the underlying absorbing or conducting layer is a material layer selected from the group consisting of a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof.

In one embodiment, the underlying absorbing or conducting layer is a single material layer.

In one embodiment, the underlying absorbing or conducting layer is a stack of multiple material layers.

In one embodiment, the underlying absorbing or conducting layer has a thickness approximately in the range of 1-200 nanometers.

In one embodiment, the wafer is provided further having an upper charge dissipation layer disposed above the resist layer.

In one embodiment, the method further includes, subsequent to performing the ebeam direct write lithography, developing the resist layer and etching the absorbing or conducting layer and a layer below the absorbing or conducting layer.

In one embodiment, performing the ebeam direct write lithography comprises using an ebeam approximately in the range of 10 kEV to 200 kEV with a current approximately in the range of a few uC/cm$^2$ to hundreds of uC/cm$^2$.

In an embodiment, a material stack for patterning using an e-beam tool includes a wafer having a layer for patterning. An underlying absorbing or conducting layer is disposed above the layer for patterning. A resist layer is disposed above the underlying absorbing or conducting layer.

In one embodiment, the underlying absorbing or conducting layer is a material layer selected from the group consisting of a layer of chromium (Cr), a layer of molybdenum silicide (MoSi), a layer of titanium nitride (TiN), a layer of tantalum nitride (TaN), a layer of silicon (Si), a spin-on layer of carbon such as a layer of graphene, a CVD-deposited layer of carbon, a spin-on layer of glass, a layer of tungsten (W), a layer of copper (Cu), a layer of cobalt (Co), a layer of silicon nitride (SiN), a layer of silicon carbide (SiC), and a layer of silicon dioxide (SiO$_2$).

In one embodiment, the underlying absorbing or conducting layer is a material layer selected from the group consisting of a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof.

In one embodiment, the underlying absorbing or conducting layer is a single material layer.

In one embodiment, the underlying absorbing or conducting layer is a stack of multiple material layers.

In one embodiment, the underlying absorbing or conducting layer has a thickness approximately in the range of 1-200 nanometers.

In one embodiment, material stack further includes an upper charge dissipation layer disposed above the resist layer.

What is claimed is:

1. A method of patterning a resist layer using an e-beam tool, the method comprising:
    providing a wafer having a resist layer directly on an underlying conducting layer; and
    performing ebeam direct write lithography to pattern the resist layer with incident electrons, wherein the conducting layer reflects or conducts away a substantial portion of the incident electrons to diminish backscatter.

2. The method of claim 1, wherein the underlying conducting layer is a material layer selected from the group consisting of a layer of chromium (Cr), a layer of molybdenum silicide (MoSi), a layer of titanium nitride (TiN), a layer of tantalum nitride (TaN), a layer of silicon (Si), a layer of graphene, a layer of tungsten (W), a layer of copper (Cu), and a layer of cobalt (Co).

3. The method of claim 1, wherein the underlying conducting layer is a material layer selected from the group consisting of a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof.

4. The method of claim 1, wherein the underlying conducting layer is a single material layer.

5. The method of claim 1, wherein the underlying conducting layer is a stack of multiple material layers.

6. The method of claim 1, wherein the underlying conducting layer has a thickness approximately in the range of 1-200 nanometers.

7. The method of claim 1, wherein the wafer is provided further having an upper charge dissipation layer disposed above the resist layer.

8. The method of claim 1, further comprising:
    subsequent to performing the ebeam direct write lithography, developing the resist layer and etching the conducting layer and a layer below the conducting layer.

9. The method of claim 1, wherein performing the ebeam direct write lithography comprises using an ebeam approximately in the range of 10 kEV to 200 kEV with a current approximately in the range of a few uC/cm$^2$ to hundreds of uC/cm$^2$.

10. A method of patterning a resist layer using an e-beam tool, the method comprising:
    providing a wafer having a resist layer directly on an underlying conducting layer; and
    performing ebeam direct write lithography to pattern the resist layer with incident electrons, wherein the conducting layer reflects or conducts a substantial portion of the incident electrons to tune backscatter.

11. The method of claim 10, wherein the underlying conducting layer is a material layer selected from the group consisting of a layer of chromium (Cr), a layer of molybdenum silicide (MoSi), a layer of titanium nitride (TiN), a layer of tantalum nitride (TaN), a layer of silicon (Si), a layer of graphene, a layer of tungsten (W), a layer of copper (Cu), and a layer of cobalt (Co).

12. The method of claim 10, wherein the underlying conducting layer is a material layer selected from the group consisting of a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof.

13. The method of claim 10, wherein the underlying conducting layer is a single material layer.

14. The method of claim 10, wherein the underlying conducting layer is a stack of multiple material layers.

15. The method of claim 10, wherein the underlying conducting layer has a thickness approximately in the range of 1-200 nanometers.

16. The method of claim 10, wherein the wafer is provided further having an upper charge dissipation layer disposed above the resist layer.

17. The method of claim 10, further comprising:
    subsequent to performing the ebeam direct write lithography, developing the resist layer and etching the conducting layer and a layer below the conducting layer.

18. The method of claim 10, wherein performing the ebeam direct write lithography comprises using an ebeam approximately in the range of 10 kEV to 200 kEV with a current approximately in the range of a few uC/cm$^2$ to hundreds of uC/cm$^2$.

19. A material stack for patterning using an e-beam tool, the material stack comprising:
    a wafer having a layer for patterning;
    an underlying conducting layer disposed above the layer for patterning; and
    a resist layer disposed directly on the underlying conducting layer.

20. The material stack of claim 19, wherein the underlying conducting layer is a material layer selected from the group consisting of a layer of chromium (Cr), a layer of molybdenum silicide (MoSi), a layer of titanium nitride (TiN), a layer of tantalum nitride (TaN), a layer of silicon (Si), a layer of graphene, a layer of tungsten (W), a layer of copper (Cu), and a layer of cobalt (Co).

21. The material stack of claim 19, wherein the underlying conducting layer is a material layer selected from the group consisting of a layer of ruthenium (Ru), a layer of titanium (Ti), a layer of nickel (Ni), a layer of aluminum (Al), a layer of hafnium (Hf), a layer of tantalum (Ta), a layer of zirconium (Zr), or a layer of an alloy thereof.

22. The material stack of claim 19, wherein the underlying conducting layer is a single material layer.

23. The material stack of claim 19, wherein the underlying conducting layer is a stack of multiple material layers.

24. The material stack of claim 19, wherein the underlying conducting layer has a thickness approximately in the range of 1-200 nanometers.

25. The material stack of claim 19, further comprising:
    an upper charge dissipation layer disposed above the resist layer.

* * * * *